(12) United States Patent
Sogard

(10) Patent No.: US 6,794,657 B2
(45) Date of Patent: Sep. 21, 2004

(54) MAGNETIC SHUNT ASSEMBLY FOR AN EXPOSURE APPARATUS

(75) Inventor: Michael R. Sogard, Menlo Park, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 10/000,305

(22) Filed: Nov. 30, 2001

(65) Prior Publication Data

US 2003/0102438 A1 Jun. 5, 2003

(51) Int. Cl.$^7$ .............................. G21K 5/10; G01K 5/10
(52) U.S. Cl. ............................ 250/442.11; 250/441.11
(58) Field of Search ....................... 250/441.11, 442.11, 250/492.2, 491.1

(56) References Cited

U.S. PATENT DOCUMENTS

| 4,310,764 A | 1/1982 | Iijima |
| 4,465,934 A | 8/1984 | Westerberg et al. |
| 4,607,167 A | 8/1986 | Petric |
| 4,628,466 A | 12/1986 | Tymes |
| 4,779,046 A | * 10/1988 | Rouberoi et al. ........... 324/751 |
| 4,866,280 A | 9/1989 | Ohtaka |
| 4,985,634 A | 1/1991 | Stengl et al. |
| 5,446,722 A | 8/1995 | Kojima et al. |
| 5,592,358 A | * 1/1997 | Shamouilian et al. ....... 361/234 |
| 5,876,576 A | * 3/1999 | Fu ........................... 204/298.2 |
| 6,068,784 A | * 5/2000 | Collins et al. ................ 216/68 |
| 6,285,097 B1 | 9/2001 | Hazelton et al. |

* cited by examiner

Primary Examiner—John R. Lee
Assistant Examiner—Paul M. Gurzo
(74) Attorney, Agent, or Firm—Steven G. Roeder; Jim Rose

(57) ABSTRACT

A magnetic shunt assembly (12) for an exposure apparatus (10) includes a magnetic shunt assembly (12). The apparatus (10) includes an optical assembly (24)(26), a stage (44), a first mover assembly (16) that moves the stage (44) in a first gap (37). The first mover assembly (16) is surrounded by a magnetic field. The magnetic shunt assembly (12) is positioned near the optical assembly (24)(26) approximately between the optical assembly (24)(26) and the mover assembly (16). The magnetic shunt assembly (12) is made of a material having a relatively high magnetic permeability. The magnetic shunt assembly (12) can provide a low magnetic reluctance path that redirects at least a portion of the magnetic field from the first mover assembly (16) away from the gap (37).

90 Claims, 16 Drawing Sheets

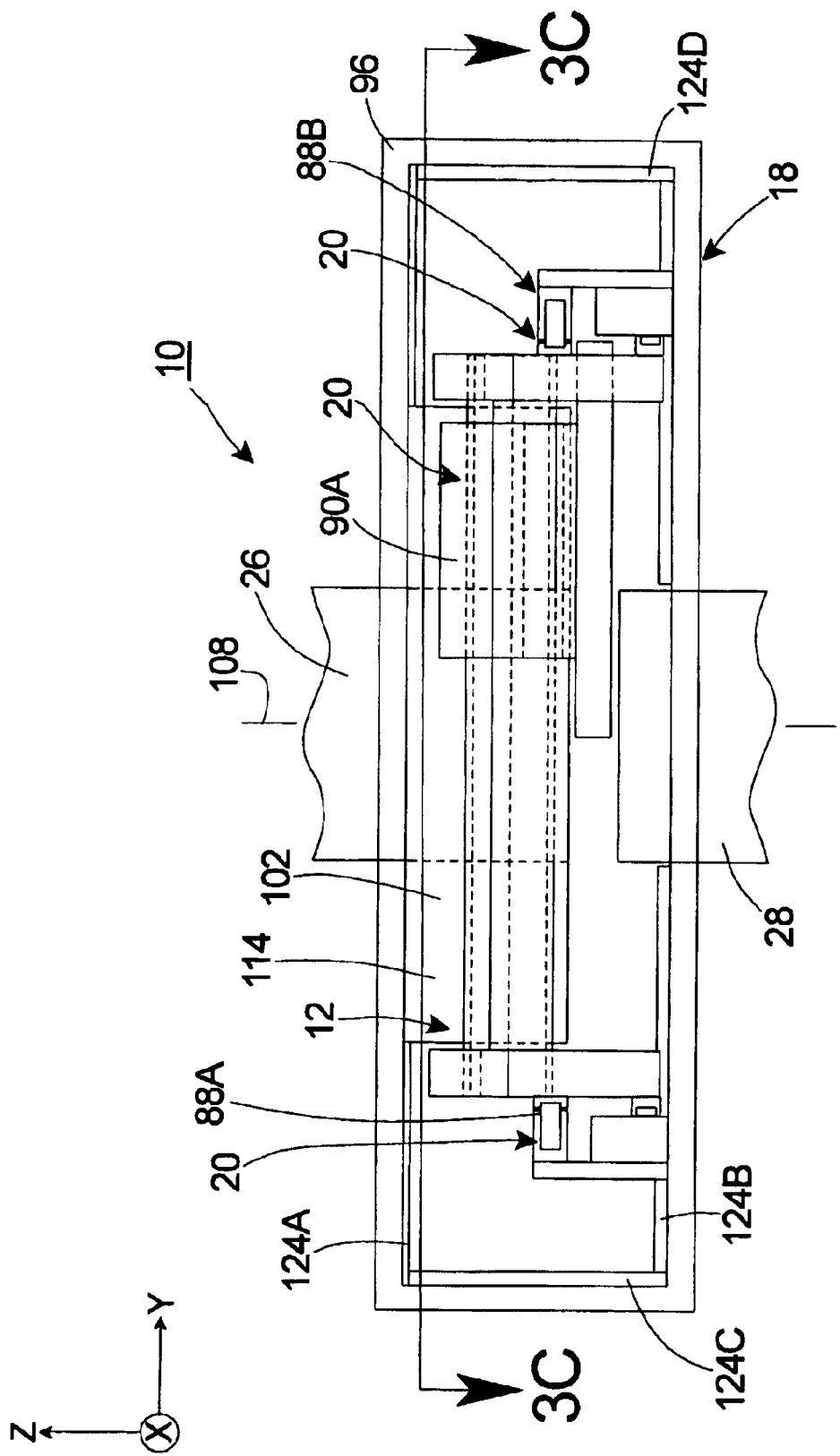

MAGNETIC SHUNT ASSEMBLY FOR AN EXPOSURE APPARATUS

FIELD OF THE INVENTION

The present invention is directed to exposure apparatuses. More specifically, the present invention is directed to a magnetic shunt assembly for an exposure apparatus.

BACKGROUND

Motors are used in a variety of electrical devices. For example, lithography systems and other semiconductor processing equipment typically utilize one or more linear motors to precisely position a reticle stage holding a reticle and a wafer stage holding a wafer. Alternately, motors are used in other devices, including machine tools, metal cutting machines, measurement machines, and inspection machines.

A typical electric motor includes a magnet component and an electrical conductor component. The magnet component includes a plurality of permanent magnets positioned adjacently. Each of the magnets generates a surrounding magnetic field. The conductor component includes one or more coils. When electric current flows in the coils, a Lorentz type force is created in a direction mutually perpendicular to the direction of the current in the coils and the magnetic field of the magnets. The force can be used to move one of the components relative to the other component of the motor. Also the electrical current in the coils typically generates additional surrounding magnetic fields.

Unfortunately, stray magnetic fields from the motors can influence a number of manufacturing, measurement, and/or inspection processes. For example, electron beams are influenced by time dependent magnetic fields of sufficient magnitude. As a result thereof, the electric motors must be positioned a relatively large distance away from the electron beam. More specifically, for an electron beam projection lithography system, the motors used to position the reticle stage and the wafer stage must be positioned a relatively large distance away from the electron beam. Similar design considerations apply to other charged particle lithography systems, including ion beam systems, as well as charged particle inspection or metrology systems.

In order to increase the performance of electron beam lithography systems, it may be necessary to improve the performance of reticle and/or wafer stages. This may require integrating the electric motors directly into the reticle stage and the wafer stage. This means the motors must be positioned relatively close to the electron beam. As a result thereof, the surrounding, or stray, time dependent magnetic fields from the motors present a problem.

In light of the above, there is a need for an assembly that reduces the magnitude of the stray magnetic fields from the motors near the beam, without significantly degrading the dynamic performance of the stage assembly. Further, there is a need for an improved stage assembly for an exposure apparatus that utilizes a charged particle beam. Moreover, there is a need for a stage assembly for precisely positioning a device during a manufacturing, measurement and/or an inspection process. Additionally, there is a need for an exposure apparatus capable of manufacturing precision devices, such as high density, semiconductor wafers.

SUMMARY

The present invention is directed to a magnetic field shielding system consisting of a magnetic shunt assembly for an exposure apparatus. The exposure apparatus includes an optical assembly, a gap within the optical assembly, and a stage assembly having a stage and a mover assembly that moves the stage in the gap. The mover assembly is a source of magnetic fields which surround it. The magnetic shunt assembly includes a first magnetic shunt positioned near the optical assembly approximately between the optical assembly and at least a portion of the mover assembly. The first magnetic shunt is made of a magnetically permeable material. With this design, the first magnetic shunt provides a low magnetic reluctance path that redirects at least a portion of the magnetic field from the mover assembly away from the gap in the optical assembly.

A number of alternate embodiments of the magnetic shunt assembly are provided herein. In some of the embodiments, the magnetic shunt assembly also includes a second magnetic shunt. In this design, the first magnetic shunt can be positioned above the stage near the gap and the second magnetic shunt can be positioned below the stage near the gap. Alternately, for example, the first magnetic shunt can be positioned below the stage near the gap and the second magnetic shunt can be positioned above the stage near the gap. Further, in some embodiments, the stage assembly includes a container that encircles the stage and provides a controlled environment around the stage. In these embodiments, the magnetic shunt assembly can be secured and coupled to the container. The container may be made of magnetically permeable material which can enhance the performance of the magnetic shunt.

In some embodiments, the first magnetic shunt can be substantially flat plate shaped. Alternately, for example, in other embodiments, the first magnetic shunt can be tubular shaped.

In one or more of the embodiments, the first magnetic shunt is maintained spaced apart from the optical assembly and/or maintained spaced apart from the stage. With this design, the magnetic flux is redirected with the first magnetic shunt away from a housing of the optical assembly back to the mover assembly and the first magnetic shunt does not inhibit the movement of the stage.

The present invention is also directed to a stage assembly, an exposure apparatus, a device and a semiconductor wafer. Further, the present invention is also directed to a method for reducing stray magnetic fields, a method for manufacturing a stage assembly, and an exposure apparatus and a method for making a device and semiconductor wafer utilizing the exposure apparatus.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 3B is a cut-away view taken on line 3B—3B of FIG. 3C;

DESCRIPTION

Figure 1A:
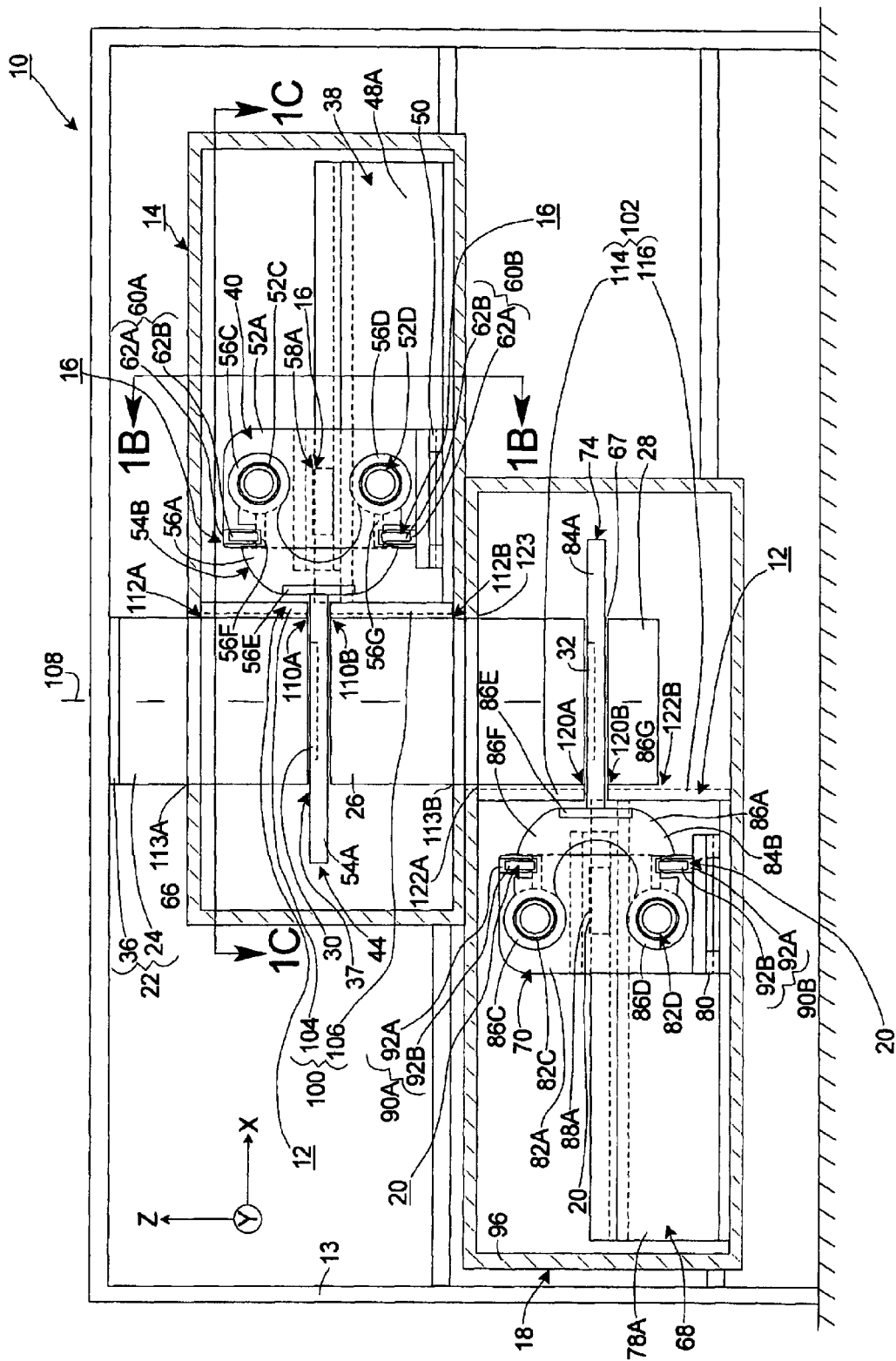
FIG. 1A is a simplified, side illustration of a first embodiment of an apparatus, in partial cut-away, with hidden lines, having features of the present invention.
Figure 1B:
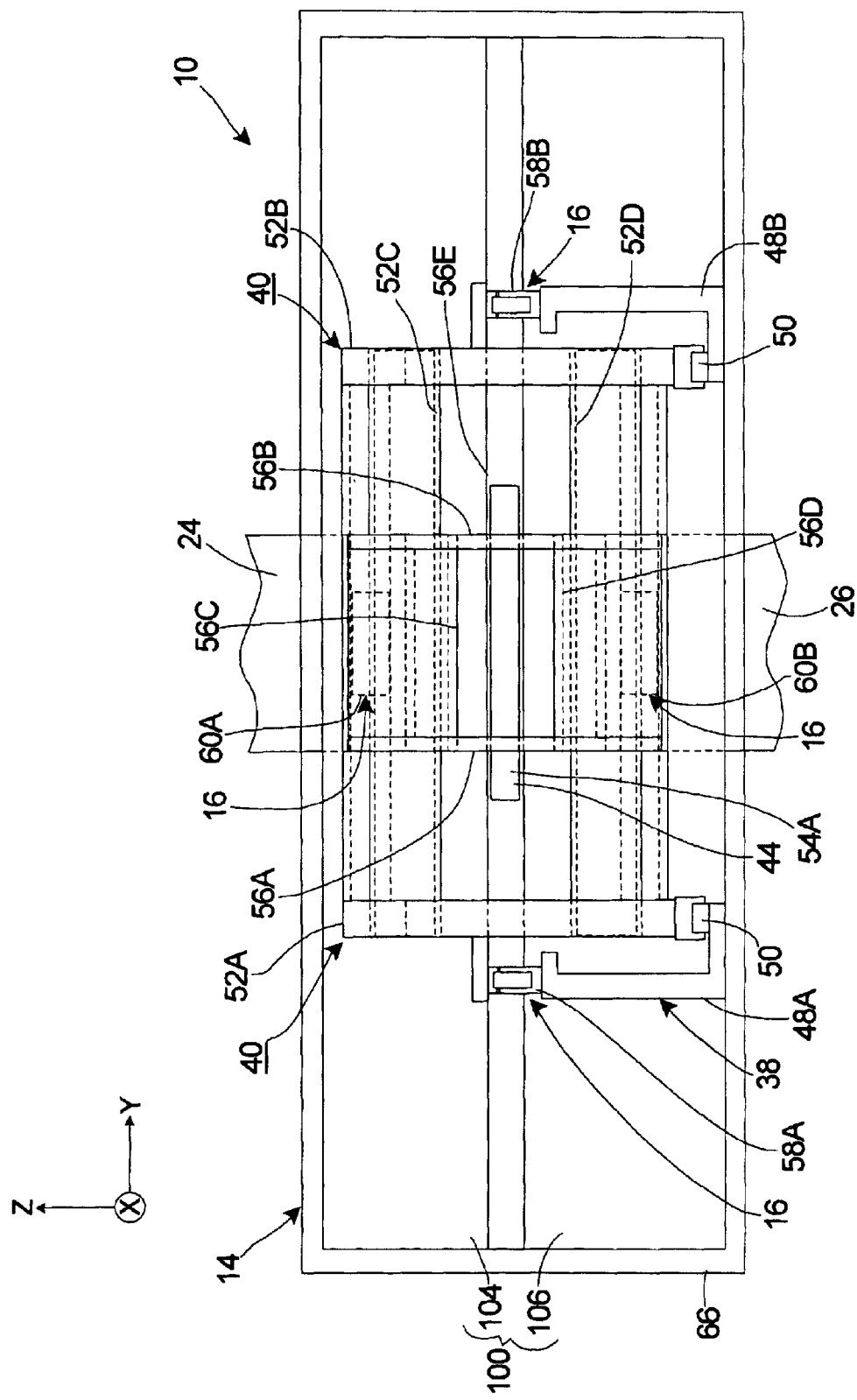
FIG. 1B is a cut-away view taken on line 1B—1B of FIG. 1A.
Figure 1C:
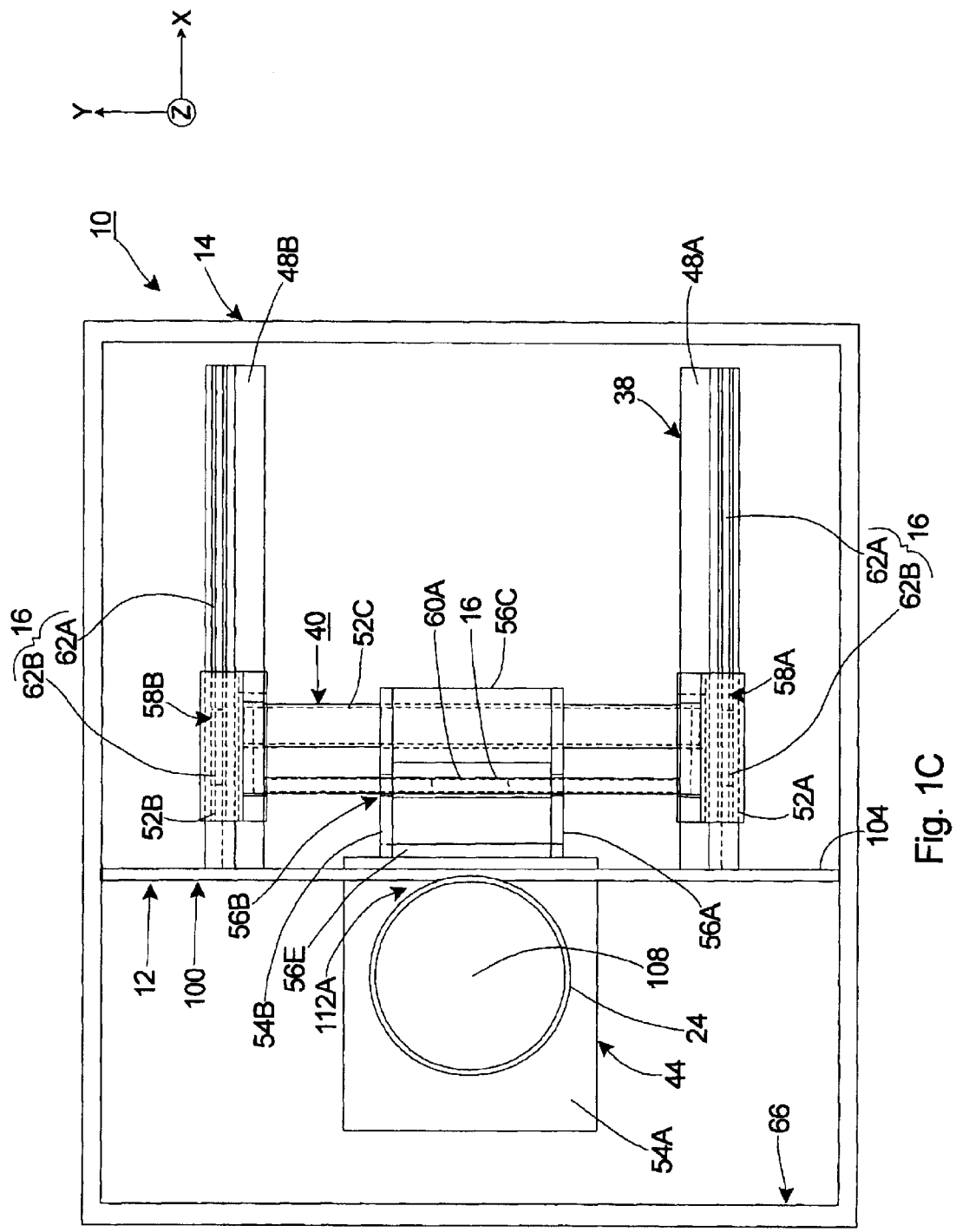
FIG. 1C is a cut-away view taken on line 1C—1C of FIG. 1A.
Figure 1D:
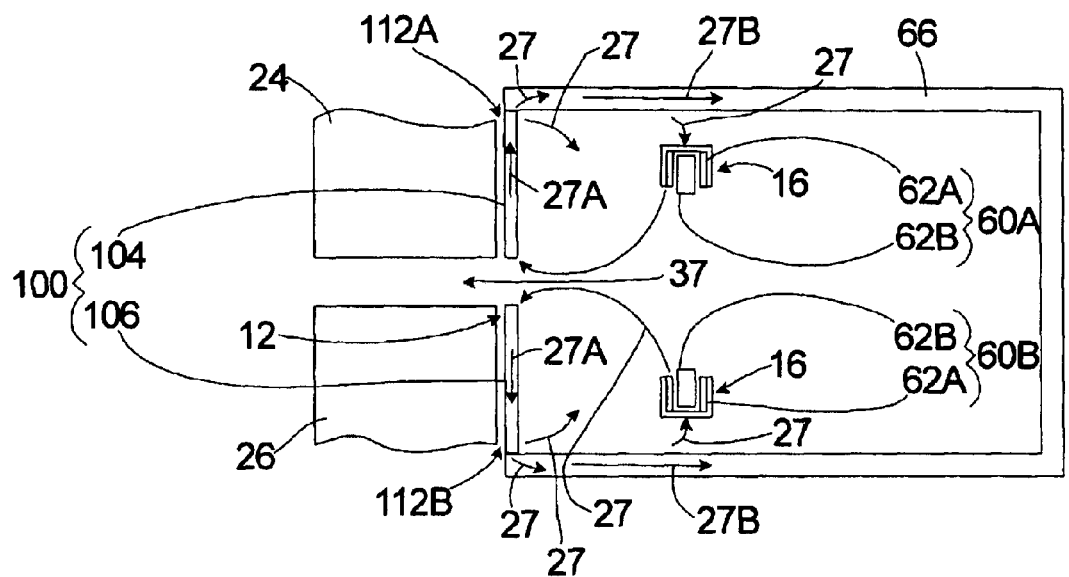
FIG. 1D is an illustration of a portion of a magnetic shunt assembly and a portion of a mover assembly having features of the present invention.

FIG. 1A is a simplified illustration of one embodiment of an apparatus 10 including a magnetic shunt assembly 12 having features of the present invention. In addition to the magnetic shunt assembly 12, the apparatus 10 illustrated in FIG. 1A includes (i) an apparatus frame 13, (ii) a first stage assembly 14 including a first mover assembly 16, (iii) a second stage assembly 18 including a second mover assembly 20, (iv) an illumination system 22 (irradiation apparatus) having an illumination optical assembly 24, and (v) a projection optical assembly 26. The mover assemblies 16, 20 are surrounded by magnetic fields 27 (a portion of the magnetic fields is illustrated in FIG. 1D). In addition, an optical base 28 may be present.

A number of embodiments of the magnetic shunt assembly 12 are provided herein. In one or more of these embodiments, the magnetic shunt assembly 12 provides a low magnetic reluctance path that redirects the magnetic fields from the respective mover assembly 16, 20 away from the optical assemblies 24, 26 without significantly influencing the dynamic performance of the respective stage assembly 14, 18.

The apparatus 10 may be for lithography, metrology, or inspection. The apparatus 10 is particularly useful as an exposure apparatus such as a lithographic tool that transfers a pattern (not shown) of an integrated circuit from a first device 30 such as a reticle onto a second device 32 such as a semiconductor wafer.

There are a number of different types of lithographic tools. For example, the exposure apparatus 10 can be used as scanning type lithography system that exposes the pattern from the reticle 30 onto the wafer 32 with the reticle 30 and wafer 32 moving synchronously. In a scanning type lithographic device, the reticle 30 is moved perpendicular to an optical axis of the projection optical assembly 26 by the first stage assembly 14, and the wafer 32 is moved perpendicular to the optical axis of the projection optical assembly 26 by the second stage assembly 18. Scanning of the reticle 30 and the wafer 32 occurs while the reticle 30 and the wafer 32 are moving synchronously.

Alternately, for example, the exposure apparatus 10 can be a step-and-repeat type lithography system that exposes the reticle 30 while the reticle 30 and the wafer 32 are stationary. In the step and repeat process, the wafer 32 is in a constant position relative to the reticle 30 and the projection optical assembly 26 during the exposure of an individual field. Subsequently, between consecutive exposure steps, the second stage assembly 18 consecutively moves the wafer 32 perpendicular to the optical axis of the projection optical assembly 26 so that the next exposure field of the wafer 32 is brought into position relative to the projection optical assembly 26 and the reticle 30 for exposure. Following this process, the patterns on the reticle 30 are exposed onto the wafer 32, so that the next field of the wafer 32 is brought into position relative to the projection optical assembly 26 and the reticle 30.

The present invention is likely to be most useful when the irradiation consists of charged particles, such as electrons or ions. However, the present invention can also be useful in lithography systems where the irradiation consists of photons of any wavelength.

Further, the use of the apparatus 10 provided herein is not limited to a lithography system for semiconductor manufacturing. The apparatus 10, for example, can be used as an LCD lithography system that exposes a liquid crystal display device pattern onto a rectangular glass plate or a lithography system for manufacturing a thin film magnetic head.

Some of the Figures provided herein include a coordinate system that designates an X axis, a Y axis, and a Z axis. It should be understood that the coordinate system is merely for reference and can be varied. For example, the X axis can be switched with the Y axis and/or the exposure apparatus 10 can be rotated. It should also be noted that the terms first and/or second, used in the description of a number of the components of the apparatus 10 is for convenience.

The apparatus frame 13 illustrated in FIG. 1A supports the assemblies of the apparatus 10 above a mounting base 34. The design of the apparatus frame 13 can be varied to suit the design requirements for the rest of the apparatus 10. Typically, the apparatus frame 13 is generally rigid. The mounting base 34 can be the ground, a base, or floor or some other supporting structure such as a vibration isolation system.

The illumination system 22 includes an illumination source 36 and the illumination optical assembly 24. The illumination source 36 emits a beam (irradiation) of energy. The illumination source 36 can be a charged particle beam such as an ion or an electron beam. For instance, in the case where an electron beam is used, thermionic emission type lanthanum hexaboride ($LaB_6$) or tantalum (Ta) can be used as the cathode material in an electron gun. Furthermore, in the case where an electron beam is used, the exposure apparatus could be such that either a mask is used or a pattern can be directly formed on a substrate without the use of a mask, by appropriately deflecting and blanking the electron beam. In this case a reticle and reticle stage would normally not be present. Alternately, for a photolithography exposure tool the illumination source 36 can also emit a beam of light energy. The illumination source 36 can be g-line (436 nm), i-line (365 nm), KrF excimer laser (248 nm), ArF excimer laser (193 nm), or $F_2$ laser (157 nm).

In the embodiment in FIG. 1A, the illumination source 36 is illustrated as being positioned above the illumination optical assembly 24. Alternately, for example, the illumination source 36 can be secured to the side of the apparatus frame 13.

The illumination optical assembly 24 guides the irradiation from the illumination source 36 to above the first stage assembly 14. In the embodiment illustrated in the Figures, the housing of the illumination optical assembly 24 can provide some magnetic shielding of the components and the beam within the housing of the illumination optical assembly 24.

It should be noted that a first gap 37 exists between the illumination optical assembly 24 and the projection optical assembly 26. The first gap 37 allows for the positioning of the first device 30 by the first stage assembly 14 between the illumination optical assembly 24 and the projection optical assembly 26. The size of the first gap 37 can be varied to suit the design requirements of the first stage assembly 14, the first device 30, and the rest of the exposure apparatus 10. In the embodiment illustrated in FIG. 1A, the first gap 37 is between approximately 40 mm and 80 mm. However, the first gap 37 can be greater or less than this range.

The first stage assembly 14 holds and positions the reticle 30 relative to the projection optical assembly 26 and the second device 32. The design of the first stage assembly 14 and the components of the first stage assembly 14 can be varied to suit the design requirements of the apparatus 10. A simplified version of a suitable first stage assembly 14 is illustrated in FIGS. 1A–1C. In this embodiment, the first stage assembly 14 includes a first carriage support assembly 38, a first carriage 40, a first stage 44, and the first mover assembly 16.

The first carriage support assembly 38 supports and guides the movement of the first carriage 40. In the embodiment illustrated in FIGS. 1A–1C, the first carriage support assembly 38 includes a left carriage support 48A and a right carriage support 48B. Each carriage support 48A, 48B is a beam that has a substantially "C" shaped cross-section. Each carriage support 48A, 48B includes a carriage bearing 50 that guides the movement of the first carriage 40

The first carriage 40 guides the movement of the first stage 44. The first carriage 40 extends between the carriage supports 48A, 48B and is moved relative to the carriage supports 48A, 48B along the X axis with the first mover assembly 16. In the embodiment illustrated in FIGS. 1A–1C, the first carriage 40 includes (i) a left side plate 52A, (ii) a right side plate 52B spaced apart from the left side plate 52A, (iii) an upper stage guide 52C that extends between the side plates 52A, 52B, and (iv) a lower stage guide 52D that is spaced apart from the upper stage guide 52C and extends between the side plates 52A, 52B. The side plates 52A, 52B support the stage guides 52C, 52D while the stage guides 52C, 52D support and guide the movement of the first stage 44.

In this embodiment, each of the side plates 52A, 52B is somewhat rectangular plate shaped and each of the stage guides 52C, 52D is somewhat annular tube shaped. However, other configurations of the side plates 52A, 52B and the stage guides 52C, 52D are possible. The left side plate 52A extends upward from near a bottom of the left carriage support 48A and the right side plate 52B extends upward from near a bottom of the right carriage support 48B.

In this embodiment, each of the side plates 52A, 52B is maintained apart from the respective carriage support 48A, 48B with a carriage bearing 50 that allows for motion of the first carriage 40 along the X axis relative to the first carriage support assembly 38. Further, the carriage bearing 50 inhibits motion of the first carriage 40 along the Y axis and along the Z axis relative to the first carriage support assembly 38. Each bearing can include a fluid bearing that maintains the first carriage 40 spaced apart along the Z axis relative to the first carriage support assembly 38 in a non-contact manner. Alternately, the first carriage 40 can be supported relative to the first carriage support assembly 38 in other ways. For example, a ball bearing type assembly could be utilized that allows for motion of the first carriage 40 relative to the first carriage support assembly 38. Alternately, a magnetic type bearing could be utilized, provided the magnetic fields generated by the bearing are small enough not to perturb the charged particle beam in the optical assemblies.

The first stage 44 retains the first device 30. The design of the first stage 44 can be varied to suit the design requirements of the apparatus 10. In the embodiment illustrated in FIGS. 1A–1C, the first stage 44 includes a device table 54A and a stage frame 54B that is coupled to the device table 54A. The device table 54A is sized and shaped to fit within the first gap 37 between the illumination optical assembly 24 and the projection optical assembly 26. Further the device table 54A retains the first device 30. In the embodiment illustrated in the Figures, the device table 54A is generally flat plate shaped and includes an opening that allows the energy beam (not shown) to pass through the reticle 30 to the projection optical assembly 26 and a device holder (not shown) that retains the first device 30. The device holder can be, for example, an electrostatic chuck or some other type of clamp. Although typically only a single reticle 30 is used to expose a device pattern on the wafer 32, more than one reticle may sometimes be used, and several reticles may be mounted simultaneously on first stage 44.

The stage frame 54B includes (i) a left frame side 56A, (ii) a right frame side 56B spaced apart from the left frame side 56A, (iii) an upper frame guide 56C that extends between the frame sides 56A, 56B, and (iv) a lower frame guide 56D that extends between the frame sides 56A, 56B and is spaced apart from the upper frame guide 56C. In addition, the stage frame 54B includes a table bracket 56E, a frame top 56F, and a frame bottom 56G. In the embodiment illustrated in FIGS. 1A–1C, each frame side 56A, 56B is generally arc shaped, and each frame side 56A, 56B extends away from the frame guides 56C, 56D towards the illumination optical assembly 24. Each frame guide 56C, 56D is generally annular tube shaped and is sized, shaped and positioned to receive the respective stage guides 52C, 52D.

In this embodiment, each of the frame guides 56C, 56D is maintained apart from the respective stage guides 52C, 52D with a bearing (not shown) that allows for motion of the first stage 44 relative to the first carriage 40 along the Y axis. Further, the bearing inhibits motion of the first stage 44 relative to the first carriage 40 along the X axis and along the Z axis. Each bearing can be a fluid bearing that maintains the first stage 44 spaced apart relative to the first carriage 40 in a non-contact manner. Alternately, the first stage 44 can be supported relative to the first carriage 40 in other ways. For example, a ball bearing type assembly could be utilized that allows for motion of the first stage 44 relative to the first carriage 40. Alternately, a magnetic type bearing could be utilized, provided the magnetic fields generated by the bearing are small enough not to perturb the charged particle beam in the optical assemblies.

The first mover assembly 16 moves and positions the first stage 44 along the X axis and along the Y axis. Alternately, for example, the first mover assembly 16 could be designed to move the first stage 44 relative to the rest of the apparatus 10 along the X axis, along the Y axis, along the Z axis, about the X axis, about the Y axis and/or about the Z axis. In the embodiment illustrated in the Figures, the first mover assembly 16 includes (i) a left X mover 58A and a spaced apart right X mover 58B that cooperate to move the first carriage 40 and the first stage 44 along the X axis and (ii) an upper Y mover 60A and a spaced apart lower Y mover 60B that cooperate to move the first stage 44 along the Y axis.

The design of the movers 58A, 58B, 60A, 60B can be varied. For example, each of the movers 58A, 58B, 60A, 60B can be a rotary motor, a planar motor, a voice coil motor, a linear motor, an electromagnetic actuator, and/or some other type of force actuator. In the embodiment illustrated in FIGS. 1A–1C, each of the movers 58A, 58B, 60A, 60B is a linear motor that includes a magnet component 62A and an electrical conductor component 62B. The magnet component 62A includes one or more magnet arrays and the electrical conductor component 62B includes one or more conductor arrays. Each of the magnet arrays includes one or more magnets. Each of the magnets is preferably made of a high magnetic energy product, rare earth, permanent magnetic material such as NdFeB. Alternately, for example, each magnet can be made of a low magnetic energy product, ceramic or other type of material that is surrounded by a magnetic field. The conductor array includes one or more electrical conductor coils.

Referring back to FIGS. 1A–1C, (i) for the left X mover 58A, the magnet component 62A is secured to the left carriage support 48A and the conductor component 62B is secured to the left side plate 52A, (ii) for the right X mover 58B, the magnet component 62A is secured to the right carriage support 48B and the conductor component 62B is secured to the right side plate 52B, (iii) for the upper Y mover 60A, the magnet component 62A is secured to the first carriage 40 and the conductor component 62B is secured to the first stage 44, and (iv) for the lower Y mover 60B, the magnet component 62A is secured to the first carriage 40 and the conductor component 62B is secured to the first stage 44. With this design, only the Y movers 60A, 60B have moving magnetic components 62A and moving magnetic fields. The moving magnetic fields create time dependent magnetic fields at the optical assemblies and can be problematic. In addition the electrical conductor components 62B also generate time dependent magnetic fields when the first mover assembly 16 is energized, and these magnetic fields may also perturb the electron beam.

Alternately, for example, the first mover assembly 46 can be designed so that (i) for the left X mover 58A, the conductor component 62B is secured to the left carriage support 48A and the magnet component 62A is secured to the left side plate 52A, (ii) for the right X mover 58B, the conductor component 62B is secured to the right carriage support 48B and the magnet component 62A is secured to the right side plate 52B, (iii) for the upper Y mover 60A, the conductor component 62B is secured to the first carriage 40 and the magnet component 62A is secured to the first stage 44, and (iv) for the lower Y mover 60B, the conductor component 62B is secured to the first carriage 40 and the magnet component 62A is secured to the first stage 44. With this design, all of the movers 58A, 58B, 60A, 60B have moving magnetic components 62A and moving magnetic fields.

Additionally, the first stage assembly 14 can include a first container 66 that encloses the reticle 30 and is used to provide a controlled environment around the reticle 30. Stated another way, the first container 66 surrounds the first stage assembly 14, allows for a controlled environment surrounding the first stage 44 and the first device 30, and the first container 66 can provide magnetic shielding from external sources of magnetic fields. The controlled environment, for example, can be a vacuum, or an inert gas. As described more fully below, if the container 66 provides magnetic shielding, it may be advantageous to separate the container 66 from the optical assemblies 24, 26 by small gaps 113A, 113B. The first container 66 can be sealed to the illumination optical assembly 24 and the projection optical assembly 26 with mechanical bellows, made of a non-magnetic material, (not shown), or flexible organic or inorganic seals, such as o-ring seals. In this embodiment, the first container 66 is generally box shaped.

In the embodiment illustrated in FIGS. 1A–1C, the bottom of the first container 66 is secured to the apparatus frame 13 to maintain the first container 66 above the mounting base 34. Further, the bottom of each carriage support 48A, 48B is secured to the first container 66 to support the first stage assembly 14 above the mounting base 34.

If the movers 58A, 58B, 60A, 60B are used in a charged particle exposure apparatus 18, they will likely operate within a vacuum environment required by the charged particle beam. In that event, the components of the movers 58A, 58B, 60A, 60B must be vacuum compatible, and the components must be constructed and assembled using vacuum compatible materials and procedures. In addition the bearings must be vacuum compatible. For example, if fluid bearings are used, the fluid bearings must be of a vacuum compatible design.

The projection optical assembly 26 projects and/or focuses the irradiation passing through reticle 30 to the wafer 32. Depending upon the design of the apparatus 10, the projection optical assembly 26 can magnify or reduce the image created at the reticle. Alternately, the projection optical assembly 26 can be a 1× magnification system. With respect to the projection optical assembly 26, when an electron beam is used, electron optics should preferably consist of electron lenses and deflectors. The optical path for the electron beams should be in a vacuum.

The projection optical assembly 26 can include a housing that provides magnetic shielding for the components within the housing of the projection optical assembly 26.

It should be noted that a second gap 67 may exist between the projection optical assembly 26 and the optical base 28. An optical base 28 may be necessary if the projection optical assembly 26 is an immersion type, where the second device 32 normally lies within a magnetic field of significant magnitude, generated by the projection optical assembly, and this magnetic field significantly determines the optical properties and performance of the projection optical assembly 26. The second gap 67 allows for the positioning of the second device 32 by the second stage assembly 18 below the projection optical assembly 26. The size of the second gap 67 can be varied to suit the design requirements of the second stage assembly 18, the second device 32 and the rest of the exposure apparatus 10. In the embodiment illustrated in FIG. 1A, the second gap 67 is between approximately 40 mm and 100 mm. However, the second gap 67 can be greater or less than this range. Alternately, the projection optical assembly 26 may not be an immersion type, the magnetic field at the second device 32 may be negligible as far as its effects on the optical properties of the the projection optical assembly 26 are concerned, and the optical base 28 may be absent. In either case, stray magnetic fields from the second mover assembly 20 may perturb the electron beam in the region between the bottom of the projection optical assembly 26 and the second device 32.

The second stage assembly 18 holds and positions the second device 32 with respect to the projected image of the illuminated portions of the reticle 30. The design of the second stage assembly 18 and the components of the second stage assembly 18 can be varied to suit the design requirements of the apparatus 10. In the design illustrated in FIG. 1A, the second stage assembly 18 is substantially similar to the first stage assembly 14. However, each stage assembly 14, 18 can be designed differently.

More specifically, a simplified version of a suitable second stage assembly 18 is illustrated in FIG. 1A. In this embodiment, the second stage assembly 18 includes a second carriage support assembly 68, a second carriage 70, a second stage 74, and the second mover assembly 20.

The second carriage support assembly 68 supports and guides the movement of the second carriage 70. In the embodiment illustrated in FIG. 1A, the second carriage support assembly 68 includes a left carriage support 78A and a right carriage support (not shown). Each carriage support 78A is a beam that has a substantially "C" shaped cross-section. Each carriage support 78A includes a carriage bearing 80 that guides the movement of the second carriage 70.

The second carriage 70 guides the movement of the second stage 74. The second carriage 70 extends between the carriage supports 78A and is moved relative to the carriage supports 78A along the X axis with the second mover assembly 20. In the embodiment illustrated in FIG. 1A, the second carriage 70 includes (i) a left side plate 82A, (ii) a right side plate (not shown) spaced apart from the left side plate 82A, (iii) an upper stage guide 82C that extends between the side plates 82A, and (iv) a lower stage guide 82D that is spaced apart from the upper stage guide 82C and extends between the side plates 82A. The side plates 82A support the stage guides 82C, 82D while the stage guides 82C, 82D support and guide the movement of the second stage 74.

In this embodiment, each of the side plates 82A is somewhat rectangular plate shaped and each of the stage guides 82C, 82D is somewhat annular tube shaped. However, other configurations of the side plates 82A and the stage guides 82C, 82D are possible. The left side plate 82A extends upward from near a bottom of the left carriage support 78A and the right side plate extends upward from near a bottom of the right carriage support.

In this embodiment, each of the side plates 82A, 82B is maintained apart from the respective carriage support 78A, 78B with a carriage bearing 80 that allows for motion of the second carriage 70 along the X axis relative to the second carriage support assembly 68. Further, the carriage bearing 80 inhibits motion of the second carriage 70 along the Y axis and along the Z axis relative to the second carriage support assembly 68. The carriage bearing 80 can be a fluid bearing that maintains the second carriage 70 spaced apart along the Z axis relative to the second carriage support assembly 68 in a non-contact manner. Alternately, the second carriage 70 can be supported relative to the second carriage support assembly 68 in other ways. For example, a ball bearing type assembly could be utilized that allows for motion of the second carriage 70 relative to the second carriage support assembly 68. Alternately, a magnetic type bearing could be utilized, provided the magnetic fields generated by the bearing are small enough not to perturb the charged particle beam in the optical assemblies.

The second stage 74 retains the second device 32. The design of the second stage 74 can be varied to suit the design requirements of the apparatus 10. In the embodiment illustrated in FIG. 1A, the second stage 74 includes a device table 84A and a stage frame 84B that is coupled to the device table 84A. The device table 84A is sized and shaped to fit within the second gap 67 below the projection optical assembly 26. Further, the device table 84A retains the second device 32. In the embodiment illustrated in the Figures, the device table 84A is generally flat plate shaped. The device holder can be, for example, an electrostatic chuck or some other type of clamp.

The stage frame 84B includes (i) a left frame side 86A, (ii) a right frame side (not shown) spaced apart from the left frame side 86A, (iii) an upper frame guide 86C that extends between the frame sides 86A, and (iv) a lower frame guide 86D that extends between the frame sides 86A and is spaced apart from the upper frame guide 86C. In addition the stage frame 84B includes a table bracket 86E, a frame top 86F, and a frame bottom 86G. In the embodiment illustrated in FIG. 1A, each frame side 86A is generally arc shaped and each frame side 86A extends away from the frame guides 86C, 86D towards the illumination optical assembly 24. Each frame guide 86C, 86D is generally annular tube shaped and is sized, shaped and positioned to receive the respective stage guides 82C, 82D. In this embodiment, each of the frame guides 86C, 86D is maintained apart from the respective stage guides 82C, 82D with a bearing (not shown) that allows for motion of the second stage 74 relative to the second carriage 70. Further, the bearing inhibits motion of the second stage 74 relative to the second carriage 70 along the X axis and along the Z axis. Each bearing can be a fluid bearing that maintains the second stage 74 spaced apart relative to the second carriage 70 in a non-contact manner. Alternately, the second stage 74 can be supported relative to the second carriage 70 in other ways. For example, a ball bearing type assembly could be utilized that allows for motion of the second stage 74 relative to the second carriage 70. Alternately, a magnetic type bearing could be utilized, provided the magnetic fields generated by the bearing are small enough not to perturb the charged particle beam in the optical assemblies.

The second mover assembly 20 moves and positions the second stage 74 along the X axis and along the Y axis. Alternately, for example, the second mover assembly 20 could be designed to move the second stage 74 relative to the rest of the apparatus 10 along the X axis, along the Y axis, along the Z axis, about the X axis, about the Y axis and/or about the Z axis. In the embodiment illustrated in the Figures, the second mover assembly 20 includes (i) a left X mover 88A and a spaced apart right X mover (not shown) that cooperate to move the second carriage 70 and the second stage 74 along the X axis and about the Z axis and (ii) an upper Y mover 90A and a spaced apart lower Y mover 90B that cooperate to move the second stage 74 along the Y axis.

The design of the movers 88A, 90A, 90B can be varied. For example, each of the movers 88A, 90A, 90B can be a rotary motor, a planar motor, a voice coil motor, a linear motor, an electromagnetic actuator, and/or some other type of force actuator. In the embodiment illustrated in FIG. 1A, each of the movers 88A, 90A, 90B is a linear motor that includes a magnet component 92A and an electrical conductor component 92B. The magnet component 92A includes one or more magnet arrays and the electrical conductor component 92B includes one or more conductor arrays. Each of the magnet arrays includes one or more magnets. Each of the magnets is preferably made of a high energy product, rare earth, permanent magnetic material such as NdFeB. Alternately, for example, each magnet can be made of a low energy product, ceramic or other type of material that is surrounded by a magnetic field. The conductor array includes one or more electrical conductor coils.

In the embodiment illustrated in FIG. 1A, (i) for the left X mover 88A, the magnet component (not shown) is secured to the left carriage support 78A and the conductor component (not shown) is secured to the left side plate 82A, (ii) for the right X mover, the magnet component (not shown) is secured to the right carriage support and the conductor component (not shown) is secured to the right side plate, (iii) for the upper Y mover 90A, the magnet component 92A is secured to the first carriage 70 and the conductor component 92B is secured to the second stage 74, and (iv) for the lower Y mover 90B, the magnet component 92A is secured to the second carriage 70 and the conductor component 92B is secured to the second stage 74. With this design, only the Y movers 90A, 90B have moving magnetic components 92A and moving magnetic fields. The moving magnetic fields create time dependent magnetic fields at the optical assemblies and can be problematic. In addition the electrical conductor components 92B also generate time dependent magnetic fields when the second mover assembly 20 is energized, and these magnetic fields may also perturb the electron beam.

Alternately, for example, the second mover assembly 20 can be designed so that (i) for the left X mover 88A, the conductor component is secured to the left carriage support 78A and the magnet component is secured to the left side plate 82A, (ii) for the right X mover, the conductor component is secured to the right carriage support and the magnet component is secured to the right side plate, (iii) for the upper Y mover 90A, the conductor component 92B is secured to the second carriage 70 and the magnet component 92A is secured to the second stage 74, and (iv) for the lower Y mover 90B, the conductor component 92B is secured to the second carriage 70 and the magnet component 92A is secured to the second stage 74. With this design, all of the movers 88A, 90A, 90B have moving magnetic components 92A and moving magnetic fields.

Additionally, the second stage assembly 20 can include a second container 96 that encloses the wafer 32 and is used to provide a controlled environment around the wafer 32. The controlled environment, for example, can be a vacuum, or an inert gas. The second container 96 surrounds the second stage assembly 18 and allows for a controlled environment surrounding the second stage 74 and the second device 32, and the second container 96 can provide magnetic shielding from external sources of magnetic fields. As described more fully below, if the container 96 provides magnetic shielding, it may be advantageous to separate the container 96 from the projection optical assembly 26 by a small gap 123. The second container 96 can be sealed to the projection optical assembly 28 with mechanical bellows, made of a non-magnetic material, (not shown), or flexible organic or inorganic seals, such as o-ring seals. In this embodiment, the second container 96 is generally box shaped.

In the embodiment illustrated in FIG. 1A, the bottom of the second container 96 is secured to the apparatus frame 13 to maintain the second container 96 above the mounting base 34. Further, the bottom of each carriage support 78A is secured to the second container 96 to support the second stage assembly 18 above the mounting base 34.

If the movers 88A, 90A, 90B are used in a charged particle exposure apparatus 18, they will likely operate within a vacuum environment required by the charged particle beam. In that event, the components of the movers 88A, 90A, 90B must be vacuum compatible, and the components must be constructed and assembled using vacuum compatible materials and procedures. In addition the bearings must be vacuum compatible. For example, if fluid bearings are used, the fluid bearings must be of a vacuum compatible design.

Preferably, the apparatus 10 includes a measurement assembly (not shown) that monitors the position of the first stage 44 and the second stage 74 relative to the projection optical assembly 26 or some other reference location. With this information, the first mover assembly 16 can be used to precisely position the first stage 44, and the second mover assembly 20 can be used to precisely position of the second stage 74. Typically, the measurement assembly utilizes one or more laser interferometers, encoders, and/or other measuring devices.

Figure 1E:
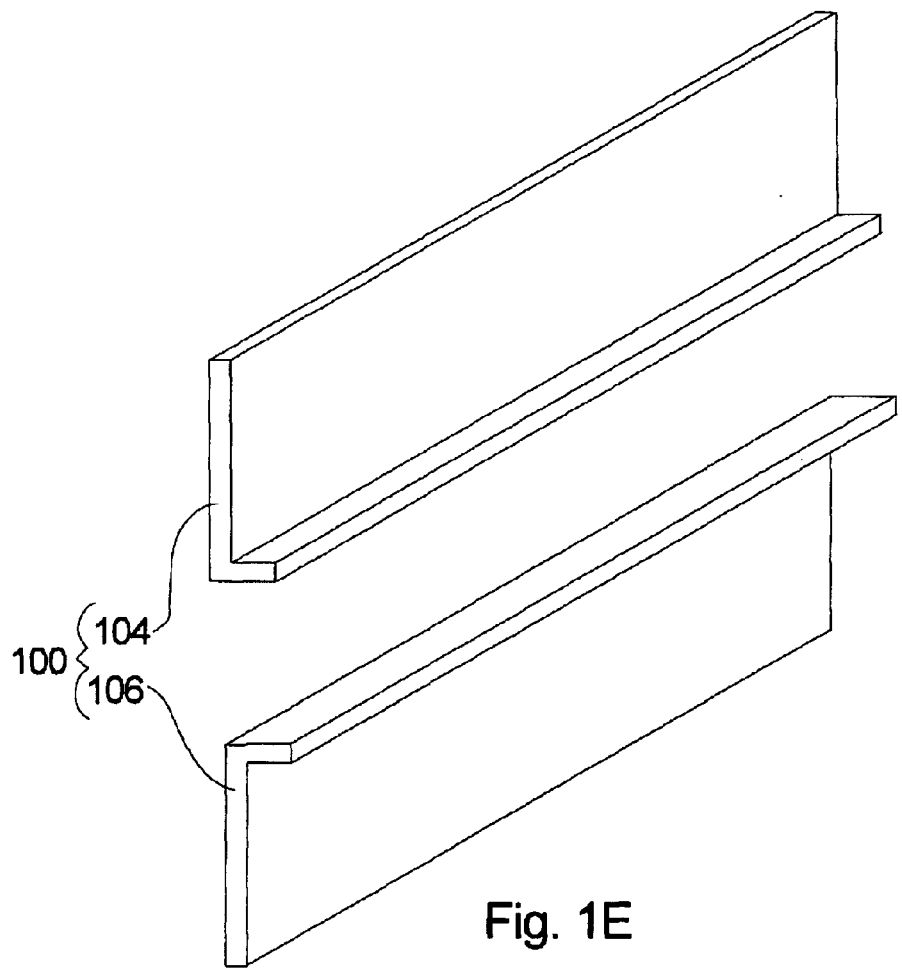
FIG. 1E is a perspective view of another embodiment of a magnetic shunt assembly having features of the present invention.
Figure 2A:
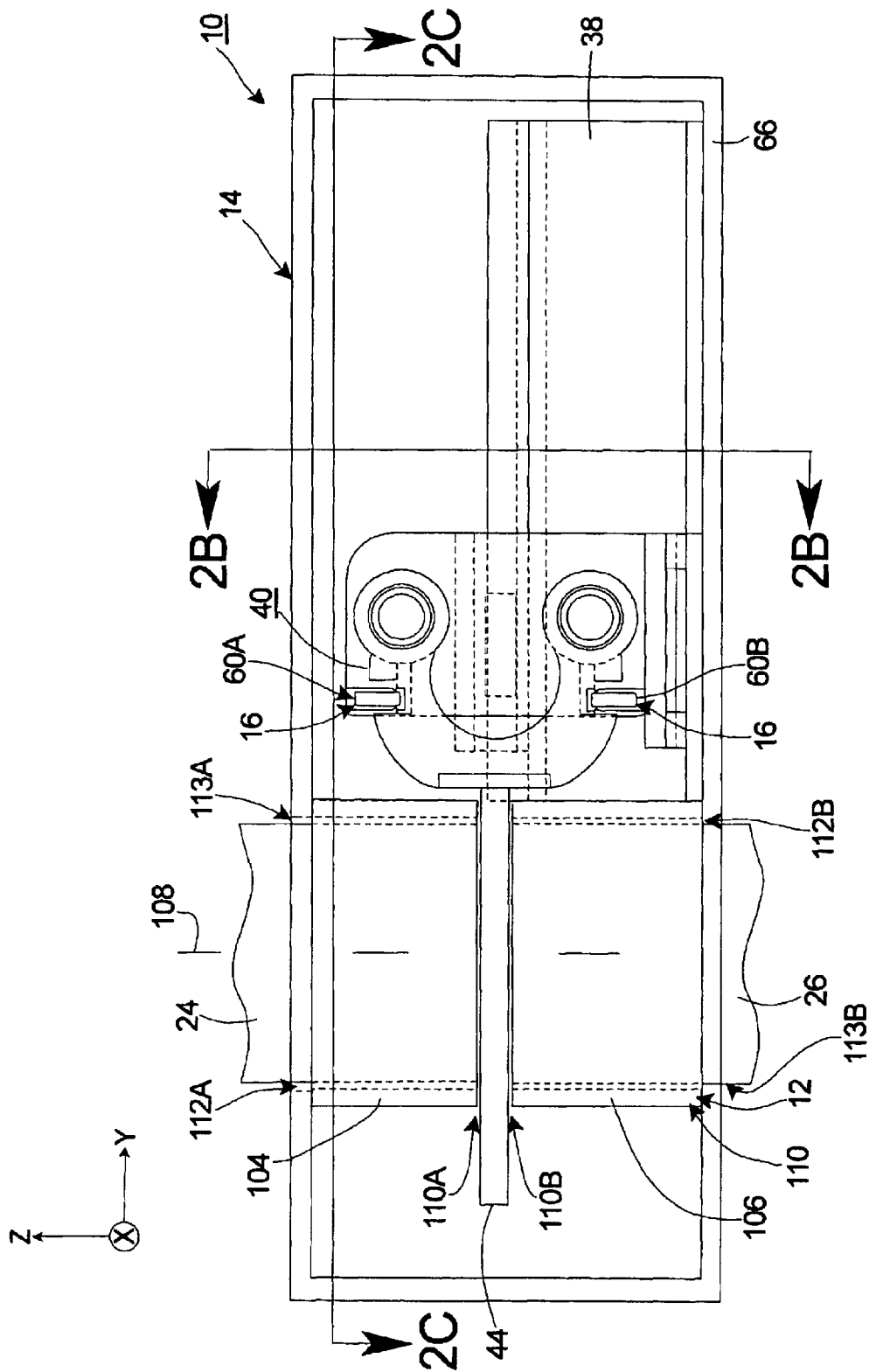
FIG. 2A is a simplified, side illustration of a portion of another embodiment of an apparatus, in partial cut-away, with hidden lines, having features of the present invention.
Figure 2B:
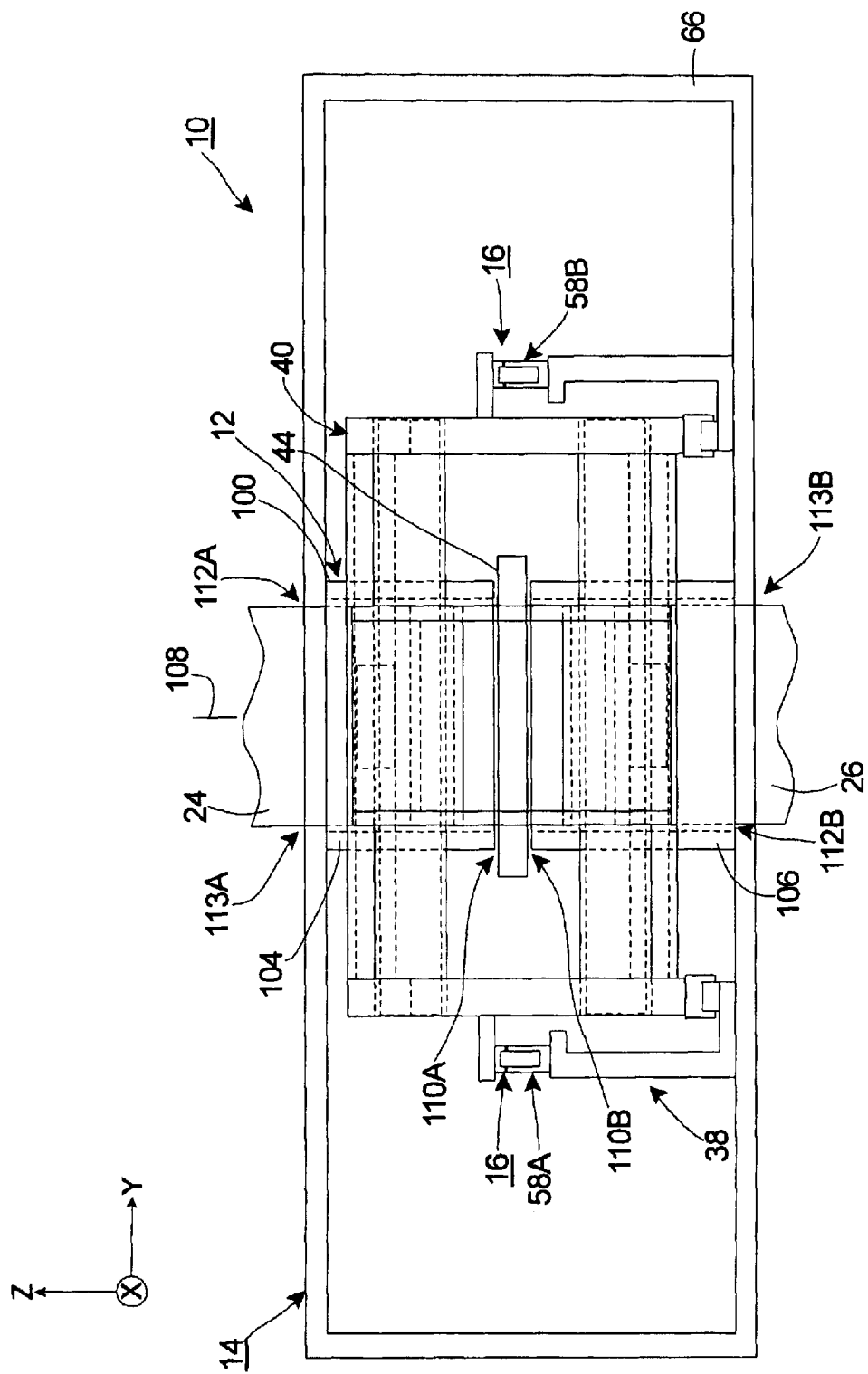
FIG. 2B is a cut-away view taken on line 2B—2B of FIG. 2C.
Figure 2C:
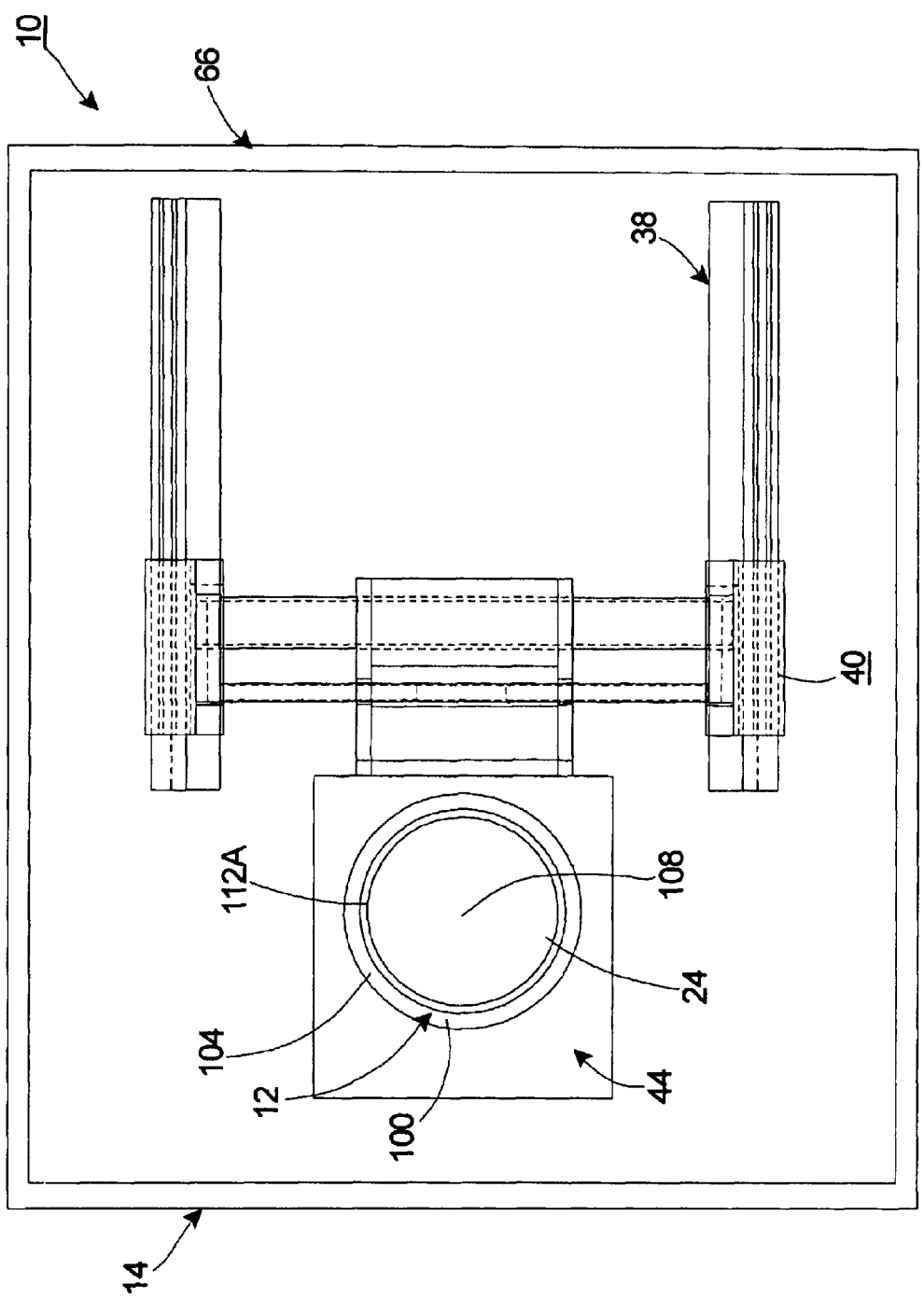
FIG. 2C is a cut-away view taken on line 2C—2C of FIG. 2B.
Figure 3A:
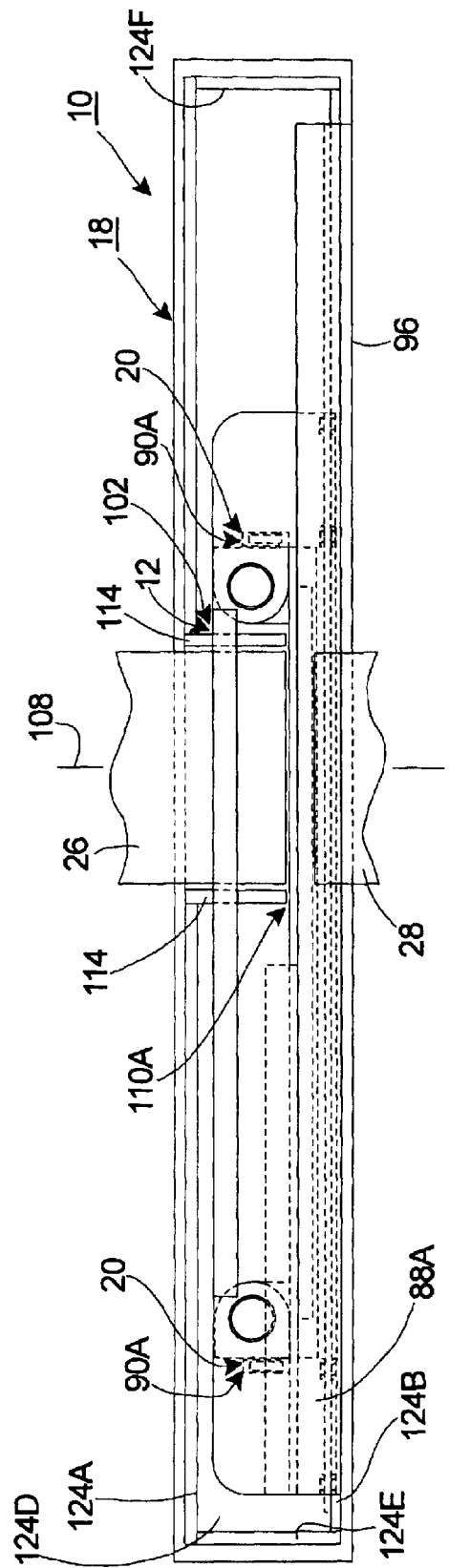
FIG. 3A is a simplified, side illustration of a portion of another embodiment of an apparatus, in partial cut-away, with hidden lines, having features of the present invention.
Figure 3C:
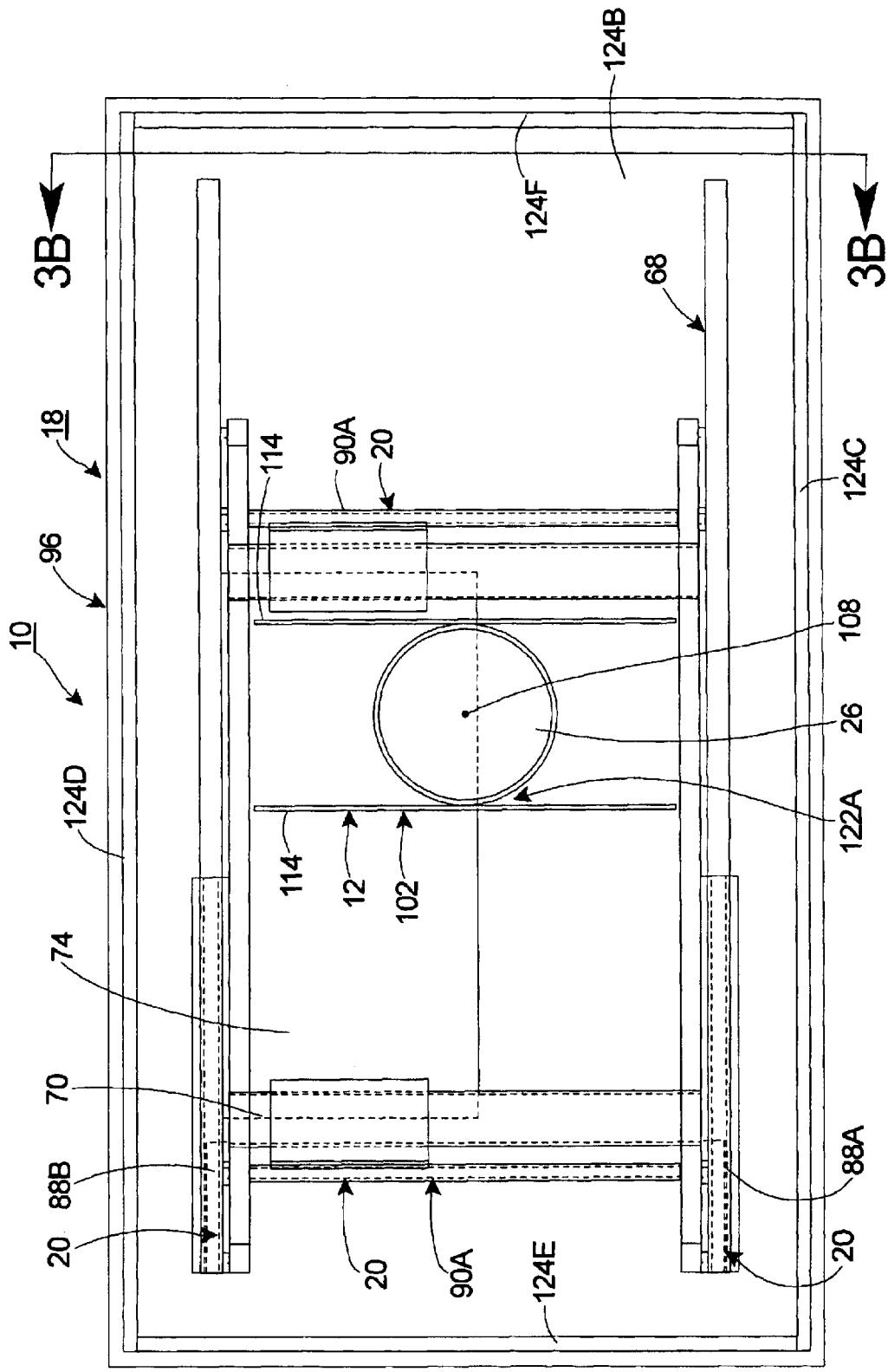
FIG. 3C is a cut-away view taken on line 3C—3C of FIG. 3B.
Figure 4A:
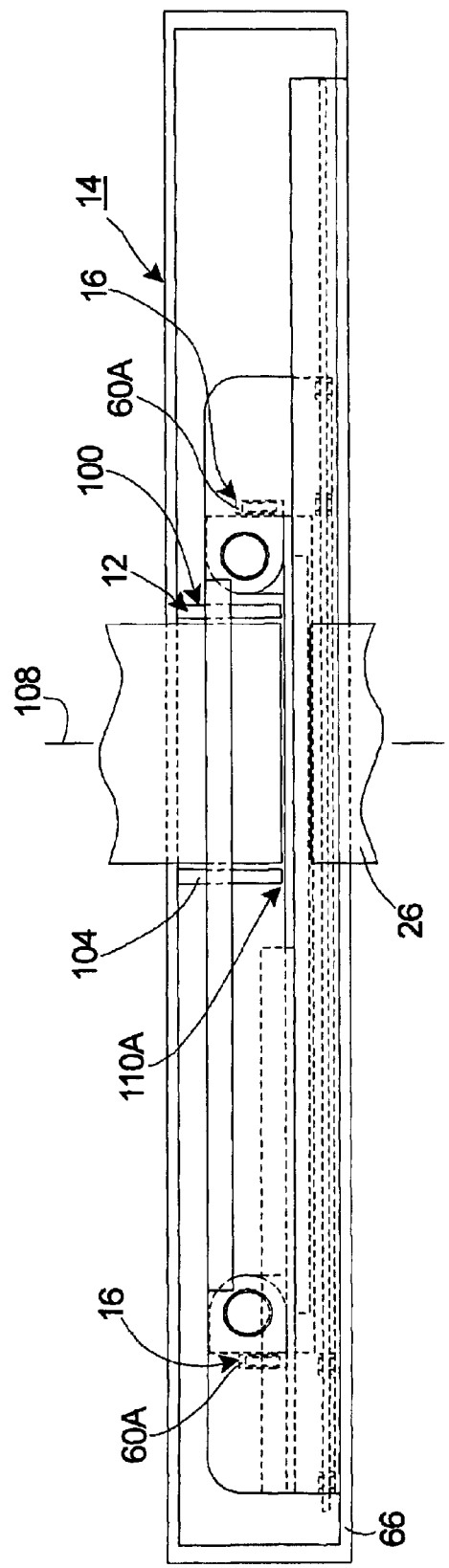
FIG. 4A is a simplified, side illustration of a portion of another embodiment of an apparatus, in partial cut-away, with hidden lines, having features of the present invention.
Figure 4B:
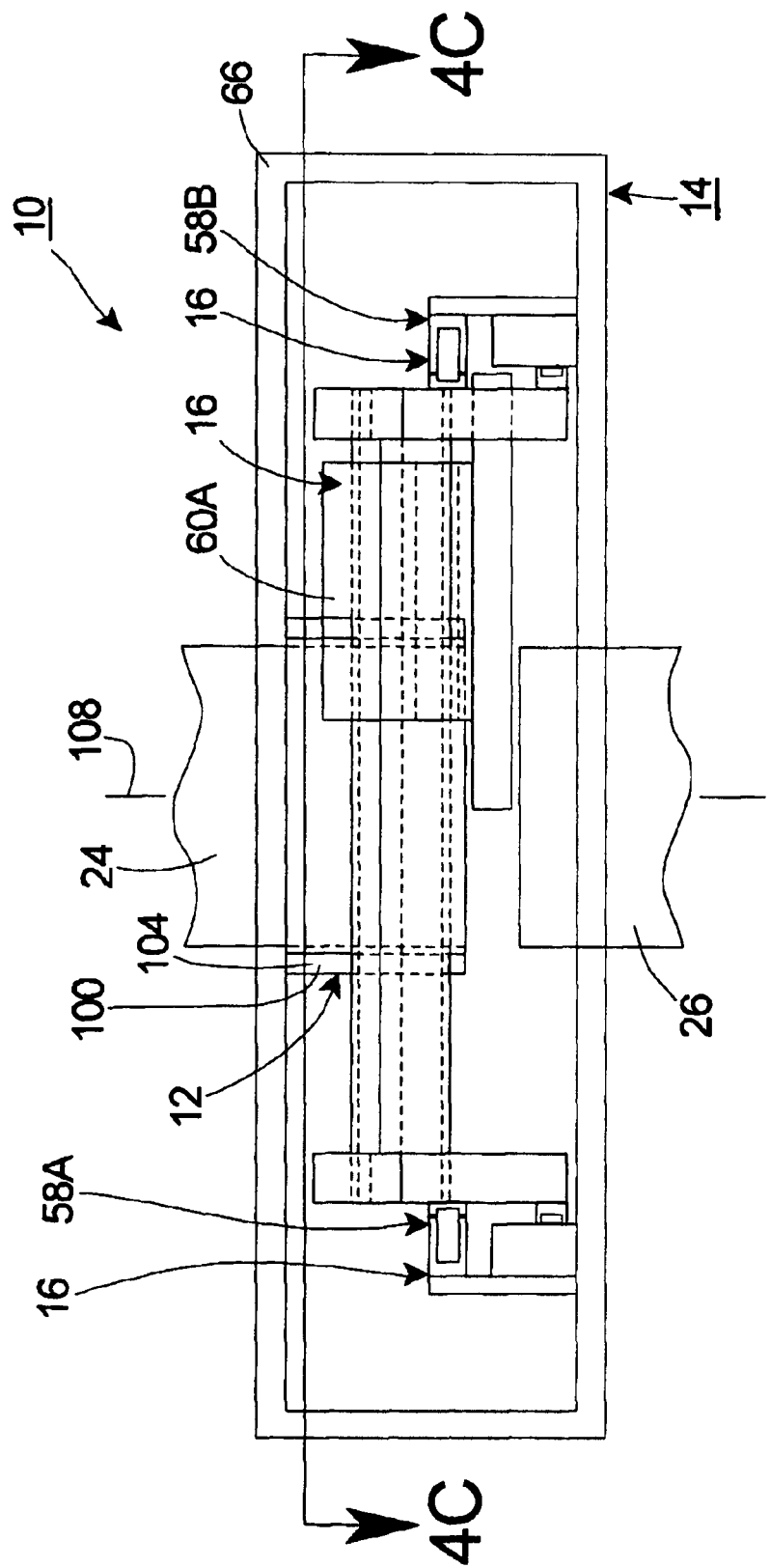
FIG. 4B is a cut-away view taken on line 4B—4B of FIG. 4C.
Figure 4C:
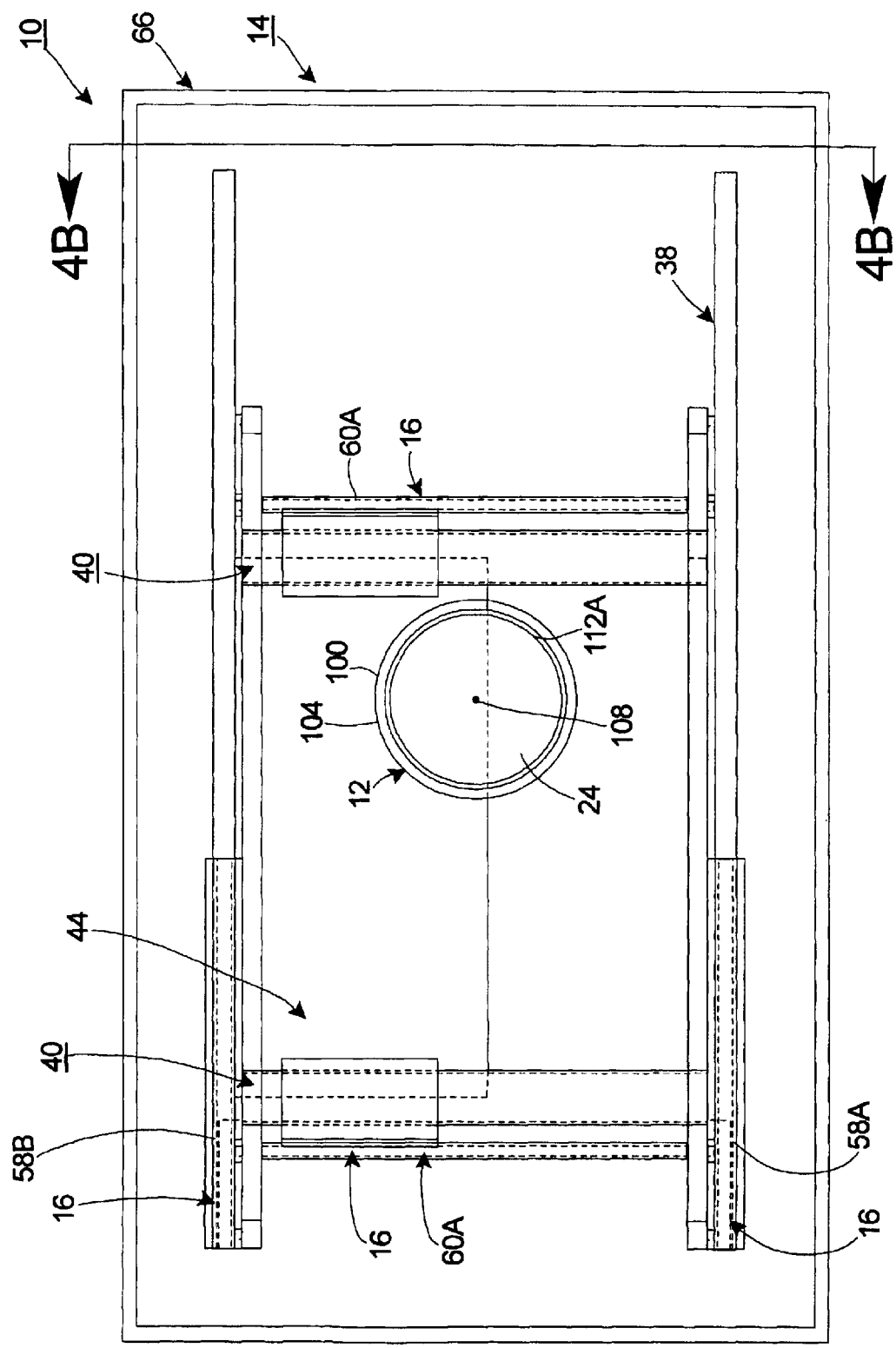
FIG. 4C is a cut-away view taken on line 4C—4C of FIG. 4B.
Figure 7B:
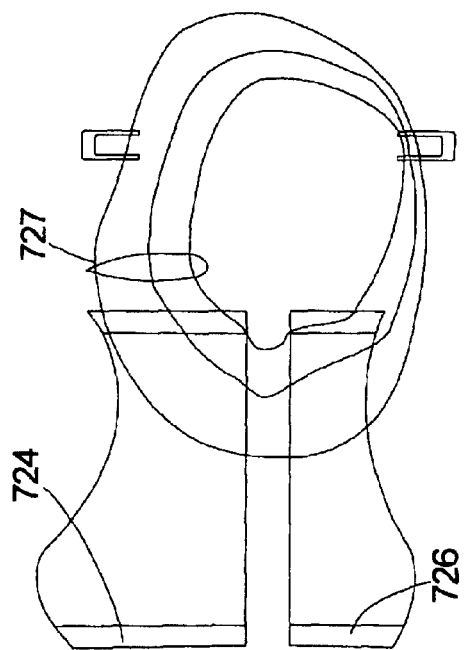
FIGS. 7B and 7C illustrate the effect of the present embodiment on magnetic field lines from a mover assembly.
Figure 7C:
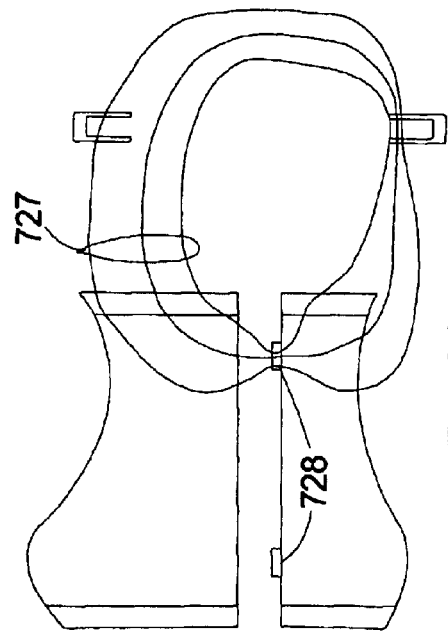
Figure 7A:
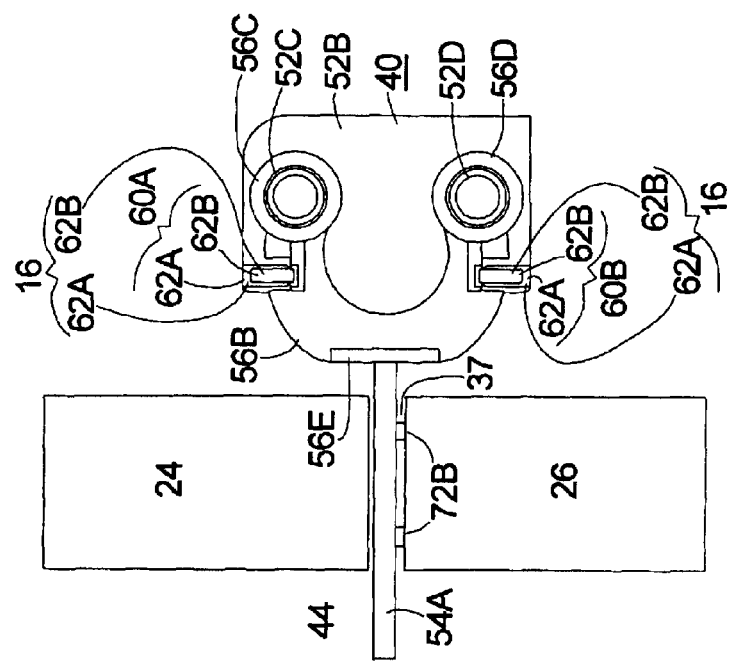
FIG. 7A is a simplified, side illustration of a portion of another embodiment of an apparatus having features of the present invention.

The primary use of the magnetic shunt assembly 12 is to reduce the perturbations of the charged particle beam in the illumination optical assembly 24, the projection optical assembly 26, and the gaps 37, 67 caused by time varying magnetic fields generated by operation of the first stage 44 and/or the second stage 74. The design of the magnetic shunt assembly 12 can be varied to suit the design requirements of the apparatus 10. A number of alternate embodiments of the magnetic shunt assembly 12 are illustrated in the Figures. In particular, FIGS. 1A–1C illustrate a first embodiment of the magnetic shunt assembly 12, FIG. 1E illustrates a second embodiment of the magnetic shunt assembly 12, FIGS. 2A–2C illustrate a third embodiment of the magnetic shunt assembly 12, FIGS. 3A–3C illustrate a fourth embodiment of the magnetic shunt assembly 12, FIGS. 4A–4C illustrate a fifth embodiment of the magnetic shunt 12, and FIGS. 7A–7C illustrate a sixth embodiment of the magnetic shunt 12. In one or more of these embodiments, the magnetic shunt assembly 12 redirects the magnetic field away from one or more of the gaps 37, 67 to minimize the magnitude of the magnetic fields entering the gaps 37, 67 and the housings of the optical assemblies 24, 26.

In the embodiment illustrated in FIGS. 1A–1C, the magnetic shunt assembly 12 includes (i) a first magnetic shunt subassembly 100 positioned near the first gap 37 and the first stage assembly 14, and (ii) a second magnetic shunt subassembly 102 positioned near the second gap 67 and the second stage assembly 18. In this embodiment, the design of the first magnetic shunt subassembly 100 is substantially the same as the design of the second magnetic shunt subassembly 102. Alternately, the design of the first magnetic shunt subassembly 100 can differ from the design of the second magnetic shunt subassembly 102. Still alternately, the magnetic shunt assembly 12 can include only one of the magnetic shunt subassemblies 100, 102.

In the embodiment illustrated in FIGS. 1A–1C, the first magnetic shunt subassembly 100 includes (i) a first magnetic shunt 104 positioned above the first stage 44 between the upper Y mover 60A and the illumination optical assembly 24 and (ii) a second magnetic shunt 106 positioned below the first stage 44 between the lower Y mover 60B and the projection optical assembly 26. In this embodiment, each magnetic shunt 104, 106 is substantially flat plate shaped and extends substantially perpendicular to the first stage 44 and substantially parallel with a longitudinal axis 108 of the optical assemblies 24, 26. Further, the first magnetic shunt 104 is secured to and extends downward from the top of the first container 66 between the sides of the first container 66 towards the first stage 44 and the second magnetic shunt 106 is secured to and extends upward from the bottom of the first container 66 between the sides of the first container 66 towards the first stage 44. Alternately, for example, the first magnetic shunt subassembly 100 can include only one of the magnetic shunts 104, 106.

In the embodiment illustrated in FIGS. 1A–1C, the magnetic shunts 104, 106 are spaced apart from the first stage 44. More specifically, an upper gap 110A exists between the bottom of the first magnetic shunt 104 and the first stage 44 and a lower gap 110B exists between the top of the second magnetic shunt 106 and the first stage 44 to allow for easy movement of the first stage 44 relative to the magnetic shunts 104, 106. The size of each gap 110A, 110B can be varied to suit the design requirements of the first stage assembly 14 and the rest of the exposure apparatus 10. In the embodiment illustrated in FIG. 1A, each gap 110A, 110B is between approximately 1 mm and 10 mm. However, each gap 110A, 110B can be greater or less than this range.

Further, in the embodiment illustrated in FIGS. 1A–1C, the magnetic shunts 104, 106 are spaced apart from the optical assemblies 24, 26. More specifically, an upper side gap 112A exists between the first magnetic shunt 104 and the illumination optical assembly 24, and a lower side gap 112B exists between the second magnetic shunt 106 and the projection optical assembly 26. The size of each gap 112A, 112B can be varied to suit the design requirements of the first stage assembly 14 and the rest of the exposure apparatus 10. In the embodiment illustrated in FIG. 1A, each gap 112A, 112B is between approximately 5 mm and 25 mm. However, each gap 112A, 112B can be greater or less than this range.

Each of the magnetic shunts 104, 106 can be made of a material having a relatively high magnetic permeability. For example, each of the magnetic shunts 104, 106 can have a magnetic permeability of at least 100 and more preferably at least 5000. Suitable materials include soft iron or permalloy or similar material. The magnetic reluctance of a structure depends both on its geometry and its magnetic permeability. The magnetic reluctance is inversely proportional to the magnetic permeability. Therefore materials with high magnetic permeability have relatively small magnetic reluctances. By contrast air or vacuum has a magnetic permeability of 1, so they offer a relatively high magnetic reluctance. Referring to FIG. 1D, with this design the magnetic shunt assembly 12 provides a low magnetic reluctance path that redirects the magnetic fields 27 from the first mover assembly 16 (only a portion shown in FIG. 1D) away from the optical assemblies 24, 26, and the first gap 37 without influencing the dynamic performance of the first stage assembly 14. Stated another way, the magnetic shunt assembly 12 provides a low magnetic reluctance path 27A for the magnetic flux lines 27 to emerge from and return to the movers 58A, 58B, 60A, 60B and reduces the amount of flux from the movers 58A, 58B, 60A, 60B leaking into the first gap 37 and the housings of the optical assemblies 24, 26.

Electron optical assemblies typically include many components of magnetically permeable material. Often the external housing is made of a magnetically permeable material, in order to provide magnetic shielding to the interior of the optical assemblies. Accordingly, the electron optical assemblies represent low magnetic reluctance regions which "attract" magnetic field lines. This can increase the intensity of magnetic field lines from the mover assemblies or elsewhere within the first or second gap. The purpose of the magnetic shunts is to offer a low reluctance path for the external magnetic fields outside of the optical assemblies. Thus, the magnetic field intensity from external sources within the gap would be expected to decrease. For proper operation, it is essential that the magnetic shunts do not contact any magnetically permeable components of the optical assemblies. This ensures that no low magnetic reluctance path between the magnetic shunt and the optical assemblies can exist, and therefore magnetic flux within the magnetic shunt will not be shared with the optical assemblies.

If the containers 66 or 96 are made of magnetically permeable material, in addition to providing shielding from magnetic fields external to the containers, they can be expected to enhance the performance of the magnetic shunts by further reducing the magnetic reluctance of a path for magnetic fields from the mover assemblies exclusive of the optical assemblies, as shown in FIG. 1D. The low magnetic reluctance path now includes the segment 27B. For the same reason as for the shunts above, when the container serves the present purpose, it is desirable to maintain a gap between the optical assembly housings and the containers. Therefore gaps 113A, 113B between the container 66 and the optical assemblies 24, 26 are provided, and gap 123 is provided between the second container 96 and the projection optical assembly 26. In the embodiment illustrated in FIGS. 1A–1C each gap 113A, 113B, 123 is between approximately 5 mm and 25 mm. However, each gap 113A, 113B, 123 can be greater or less than this range.

As a result thereof, the movers 58A, 58B, 60A, 60B of the first mover assembly 16 can be placed relatively close to the electron beam. Because, the movers 58A, 58B, 60A, 60B can be placed close to the electron beam, the movers 58A, 58B, 60A, 60B can be integrated into the first stage assembly 14, and the size and weight of the first stage assembly 14 can be reduced. Further, because the magnetic shunts 104, 106 are not secured to the first stage 44, the magnetic shunts 104, 106 do not influence the dynamic performance of the first stage assembly 14. With this design, smaller movers 58A, 58B, 60A, 60B can be used in the first mover assembly 16, and the movers 58A, 58B, 60A, 60B can more accurately position the first device 30.

Somewhat similarly, in this embodiment the second magnetic shunt subassembly 102 includes (i) a first magnetic shunt 114 positioned above the second stage 74 between the upper Y mover 90A and the illumination optical assembly 26, and (ii) a second magnetic shunt 116 positioned below the second stage 74 between the lower Y mover 90B and the optical base 28 or the longitudinal axis 108. In this embodiment, each magnetic shunt 114, 116 is substantially flat plate shaped and extends substantially perpendicular to the second stage 74 and substantially parallel with a longitudinal axis 108 of the optical assemblies 24, 26. Further, the first magnetic shunt 114 is secured to and extends downward from the top of the second container 96 between the sides of the second container 96 towards the second stage 74, and the second magnetic shunt 116 is secured to and extends upward from the bottom of the second container 96 between the sides of the second container 96 towards the second stage 74. Alternately, for example, the second magnetic shunt subassembly 102 can include only one of the magnetic shunts 104, 106.

In the embodiment illustrated in FIG. 1A, an upper gap 120A exists between the bottom of the first magnetic shunt 114 and the second stage 74 and a lower gap 120B exists between the top of the second magnetic shunt 116 and the second stage 74 to allow for easy movement of the second stage 74 relative to the magnetic shunts 114, 116. The size of each gap 120A, 120B can be varied to suit the design requirements of the second stage assembly 18 and the rest of the exposure apparatus 10. In the embodiment illustrated in FIG. 1A, each gap 120A, 120B is between approximately 1 mm and 10 mm. However, each gap 120A, 120B can be greater or less than this range.

Further, in the embodiment illustrated in FIG. 1A, an upper side gap 122A exists between the first magnetic shunt 114 and the projection optical assembly 26 and a lower side gap 122B exists between the second magnetic shunt 116 and the projection optical assembly 26. The size of each gap 122A, 122B can be varied to suit the design requirements of the second stage assembly 18 and the rest of the exposure apparatus 10. In the embodiment illustrated in FIG. 1A, each gap 122A, 122B is between approximately 5 mm and 25 mm. However, each gap 122A, 122B can be greater or less than this range.

Each of the magnetic shunts 114, 116 of the second magnetic shunt subassembly 102 can be made of similar materials as the magnetic shunts 104, 106 of the first magnetic shunt subassembly 100. With this design, the magnetic shunts 114, 116 provide a low magnetic reluctance path that redirects the magnetic fields from the second mover assembly 20 away from the projection optical assembly 26 without significantly influencing the dynamic performance of the movers 88A, 90A, 90B. Stated another way, the magnetic shunt assembly 12 provides a low magnetic reluctance path for the magnetic flux lines to emerge from and return to the movers 88A, 90A, 90B and reduces the amount of flux from the movers 88A, 90A, 90B leaking into the second gap 67 and the housing 926 of the projection optical assembly 26.

If the container 96 is made of magnetically permeable material, in addition to providing shielding from magnetic fields external to the containers, it can enhance the performance of the magnetic shunts 114, 116 by further reducing the magnetic reluctance of a path for magnetic fields from the mover assemblies exclusive of the optical assemblies, as shown in FIG. 1D. For the same reason as for the shunts above, when the container serves the present purpose, it is desirable to maintain a gap between the optical assembly housings and the containers. Therefore gap 123 between the container 96 and the projection optical assembly 26 is provided. Also, for similar reasons the optical base 28 may be magnetically isolated from the magnetic shunt 116 and the container 96.

As a result thereof, the movers 88A, 90A, 90B of the second mover assembly 20 can be placed relatively close to the electron beam and the movers 88A, 90A, 90B can be integrated into the second stage assembly 18, and the size and weight of the second stage assembly 18 can be reduced. Further, because the magnetic shunts 114, 116 are not secured to the second stage 74, the magnetic shunts 114, 116 do not influence the dynamic performance of the second stage assembly 18. With this design, smaller movers 88A, 90A, 90B can be used in the second mover assembly 20, and the movers 88A, 90A, 90B can more accurately position the second device 32.

FIG. 1E illustrates an alternate embodiment of the first magnetic shunt 104 and the second magnetic shunt 106 of the first magnetic shunt subassembly 100. This embodiment is somewhat similar to the embodiment illustrated in FIGS. 1A–1C. However, in this embodiment, each of the magnetic shunts 104, 106 has an "L" shaped cross-section. It should be noted that the magnetic shunts 114, 116 of the second magnetic shunt subassembly 102 can have a similar configuration.

FIGS. 2A–2C illustrate a portion of an apparatus 10 and yet another embodiment of the magnetic shunt assembly 12. More specifically, FIGS. 2A–2C illustrate only the first stage assembly 14 and the first magnetic shunt subassembly 100. However, the second stage assembly 18 can have a similar design. Alternately, the design of the first magnetic shunt subassembly 100 can differ from the design of the second magnetic shunt subassembly 102. Still alternately, the magnetic shunt assembly 12 can include only one of the magnetic shunt subassemblies 100, 102. In this embodiment, the first stage assembly 14 is similar to the first stage assembly 14 illustrated in FIGS. 1A–1C and described above.

Further, in the embodiment illustrated in FIGS. 2A–2C, the first magnetic shunt subassembly 100 again includes (i) a first magnetic shunt 104 positioned above the first stage 44 between the upper Y mover 60A and the illumination optical assembly 24 and (ii) a second magnetic shunt 106 positioned below the first stage 44 between the lower Y mover 60B and the projection optical assembly 26. In this embodiment, each magnetic shunt 104, 106 is substantially annular tube shaped and is substantially coaxial with the longitudinal axis 108 of the optical assemblies 24, 26. Further, (i) the first magnetic shunt 104 is secured to and extends downward from the top of the first container 66 towards the first stage 44 and the first magnetic shunt 104 encircles the illumination optical assembly 24, and (ii) the second magnetic shunt 106 is secured to and extends upward from the bottom of the first container 66 towards the first stage 44 and the second magnetic shunt 106 encircles the projection optical assembly 26. Alternately, for example, the first magnetic shunt subassembly 100 can include only one of the magnetic shunts 104, 106.

This embodiment is particularly suitable for a stage assembly having movers on both sides of the column as discussed below. Alternately, for example, each of the magnetic shunts 104, 106 could be shaped like a rectangular tube or a sector of an annulus, or the magnetic shunts 104, 106 can include a number of flat plates or annular sectors that combine to partly or completely encircle the optical assemblies 24, 26.

In the embodiment illustrated in FIGS. 2A–2C, the upper gap 110A exists between the bottom of the first magnetic shunt 104 and the first stage 44 and the lower gap 110B exists between the top of the second magnetic shunt 106 and the first stage 44 to allow for easy movement of the first stage 44 relative to the magnetic shunts 104, 106. Further, in the embodiment illustrated in FIGS. 2A–2C, the upper side gap 112A exists between the first magnetic shunt 104 and the illumination optical assembly 24 and the lower side gap 112B exists between the second magnetic shunt 106 and the projection optical assembly 26. In addition, if the container 66 is magnetically permeable, gaps 113A, 113B exist between the container 66 and the optical assemblies 24, 26.

FIGS. 3A–3C illustrate a portion of an apparatus 10 and still another embodiment of the magnetic shunt assembly 12. More specifically, FIGS. 3A–3C illustrate only the second stage assembly 8 and the second magnetic shunt subassembly 102. However, the first stage assembly 14 can have a similar design. Alternately, the design of the first magnetic shunt subassembly 100 can differ from the design of the second magnetic shunt subassembly 102. Still alternately, the magnetic shunt assembly 12 can include only one of the magnetic shunt subassemblies 100, 102.

In this embodiment, the second stage assembly 18 has a bridge type configuration and includes a pair of X movers 88A, 88B positioned on one side of the longitudinal axis 108 of the optical assembly 26 and two upper Y movers 90A that are positioned on opposite sides of the longitudinal axis 108 of the optical assembly 26. In the embodiment illustrated in FIGS. 3A–3C, the second magnetic shunt subassembly 102 includes a pair of first magnetic shunts 114. The first magnetic shunts 114 are positioned above the second stage 74 between the upper Y movers 90A and the projection optical assembly 26. The first magnetic shunts 114 are spaced apart, substantially parallel and positioned on opposite sides of the longitudinal axis 108 of the optical assembly 26.

In this embodiment, each magnetic shunt 114 is substantially flat plate shaped and extends substantially perpendicular to the second stage 74 and substantially parallel with a longitudinal axis 108 of the optical assembly 26. Further, each first magnetic shunt 114 is secured to and extends downward from the top of the second container 96 between the sides of the second container 96 towards the second stage 74. Alternately, for example, the second magnetic shunt subassembly 102 can include both of the magnetic shunts 1014, 116.

In the embodiment illustrated in FIGS. 3A–3C, the upper gap 120A exists between the bottom of each first magnetic shunt 114 and the second stage 74 to allow for easy movement of the second stage 74 relative to the magnetic shunts 114, 116. Further, in the embodiment illustrated in FIGS. 3A–3C, the upper side gap 122A exists between each first magnetic shunt 114 and the projection optical assembly 26.

Additionally, referring to FIGS. 3A–3C, the second magnetic shunt subassembly 102 can include one or more container magnetic shunts 124A–124F that line the interior sides of the second container 96. This embodiment may be advantageous if the second container 96 is not made of magnetically permeable material and thus provides no magnetic shielding function. Or the second container 96 may provide some magnetic shielding, but the container magnetic shunts 124A–124F may have much higher magnetic permeability, thereby enhancing the performance of the second magnetic shunt subassembly 102. In this embodiment, the second magnetic shunt assembly 102 also includes (i) a top container magnetic shunt 124A that extends along the top of the second container 96, (ii) a bottom container magnetic shunt 124B that extends along the bottom of the second container 96, (iii) a left container magnetic shunt 124C that extends along the left wall of the second container 96, (iv) a right container magnetic shunt 124D that extends along the right wall of the first container 66, (v) a front container magnetic shunt 124E that extends along the front wall of the first container 66, and (vi) a rear container magnetic shunt 124F that extends along the rear wall of the second container 96. It should be noted that each container magnetic shunt 124A–124F can extend the entire length or only a portion of the length of the respective wall of the second container 96. The container magnetic shunts 124A–124F can each be plate shaped and can be made of a material having a relatively high permeability. In some applications, not all of the container shunt plates may be present. Further, the first magnetic shunt 114 is secured to and extends downward from the top container magnetic shunt 124A, between the sides of the second container 96 towards the second stage 74, and the second magnetic shunt 116 is secured to and extends upward from the bottom container magnetic shunt 124B between the sides of the second container 96 towards the second stage 74. Alternately, for example, the first magnetic shunt subassembly 102 can include only one of the magnetic shunts 114, 116. It should also be noted that any of the embodiments of the magnetic shunt assembly 12 can include the container magnetic shunts 124A–124F.

FIGS. 4A–4C illustrate a portion of an apparatus 10 and still another embodiment of the magnetic shunt assembly 12. More specifically, FIGS. 4A–4C illustrate only the first stage assembly 14 and the first magnetic shunt subassembly 100. However, the second stage assembly 18 can have a similar design. Alternately, the design of the first magnetic shunt subassembly 100 can differ from the design of the second magnetic shunt subassembly 102. Still alternately, the magnetic shunt assembly 12 can include only one of the magnetic shunt subassemblies 100, 102.

In this embodiment, the first stage assembly 14 has a bridge type configuration similar to that illustrated in FIGS. 3A–3C and described above. In the embodiment illustrated in FIGS. 4A–4C, the first magnetic shunt subassembly 100 includes a first magnetic shunt 104. The first magnetic shunt 104 is positioned above the first stage 44 between the upper Y movers 60A and the illumination optical assembly 24. Further, the first magnetic shunt 104 encircles and is substantially coaxial with the longitudinal axis 108 of the optical assemblies 24, 26. In this embodiment, the first magnetic shunt 104 is substantially annular tube shaped. Further, (i) the first magnetic shunt 104 is secured to and extends downward from the top of the first container 66 towards the first stage 44. Alternately, for example, the first magnetic shunt can include a number of flat plates or annular sectors that combine to partly or completely encircle the illumination optical assembly 24.

In the embodiment illustrated in FIGS. 4A–4C, the upper gap 110A exists between the bottom of the first magnetic shunt 104 and the first stage 44 for easy movement of the first stage 44 relative to the first magnetic shunt 104. Further, in the embodiment illustrated in FIGS. 4A–4C, an upper side gap 112A exists between the first magnetic shunt 104 and the illumination optical assembly 24.

Figure 5A:
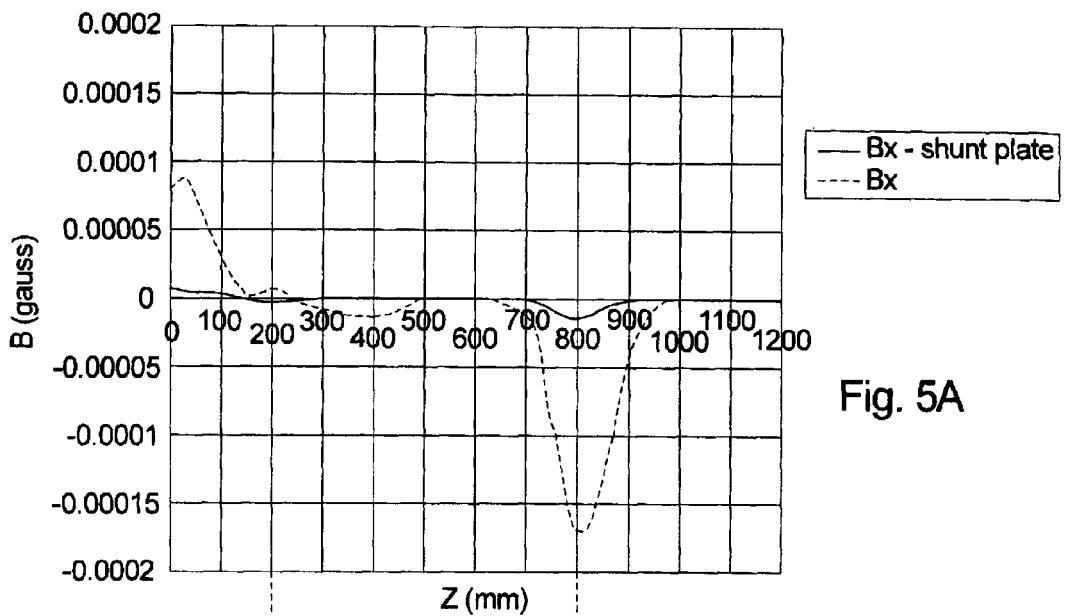
FIGS. 5A and 5B are graphs that illustrate the effect of one embodiment of the magnetic shunt assembly on the reduction of magnetic fields in a gap.
Figure 5B:
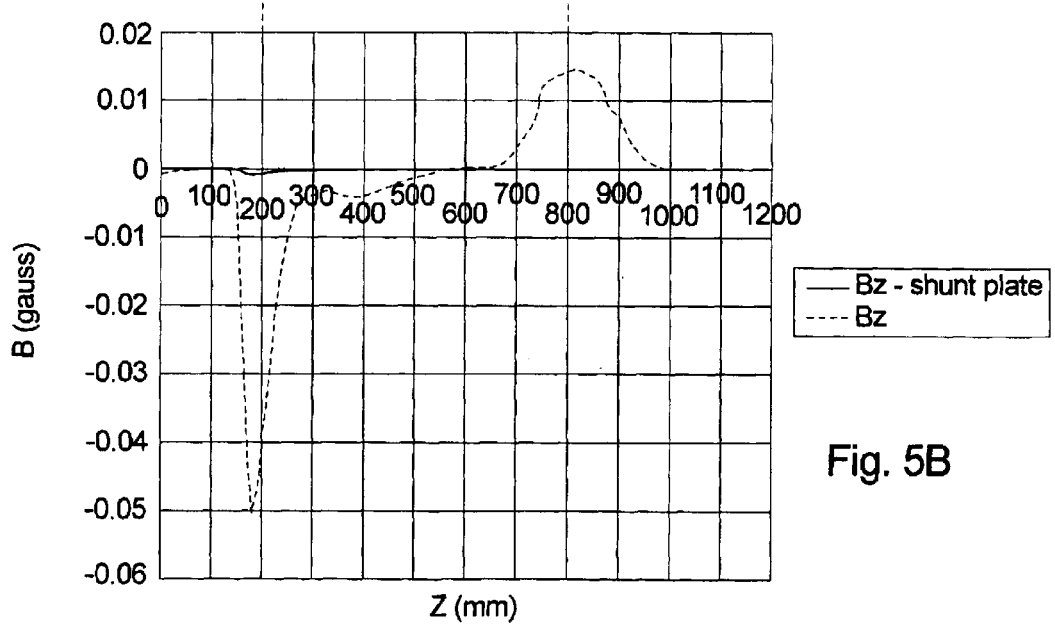

FIGS. 5A and 5B are graphs that illustrate the results of mathematical simulations of the influence of the magnetic shunt subassembly 100 (the embodiment illustrated in FIGS. 1A–1C) on the reduction of magnetic fields along the longitudinal axis 108 of the projection optical assembly 26. The transverse (Bx) and longitudinal (Bz) magnetic fields from the permanent magnets of the movers 62A, are reduced to 9.1% and 2.4% respectively of their values when the magnetic shunts 104, 106 are present. The actual values of the magnetic fields along the axis 108 are also influenced by the magnetic design of the optical assemblies 24, 26.

Figure 6A:
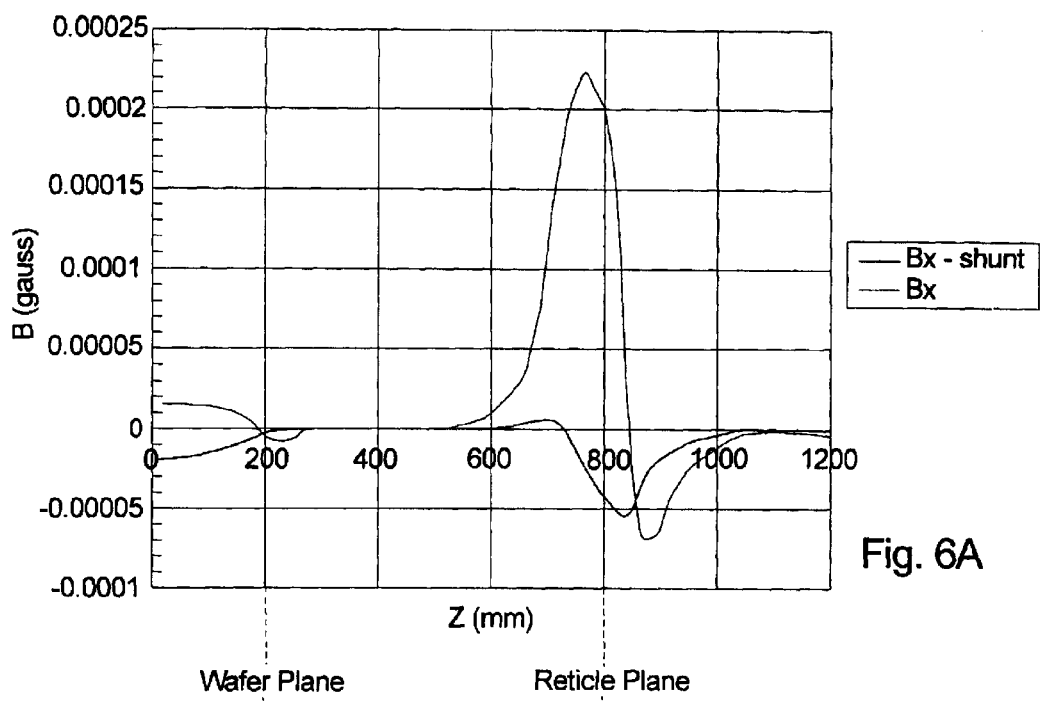
FIGS. 6A and 6B are graphs that illustrate the effect of another embodiment of the magnetic shunt assembly on the reduction of magnetic fields in the gap.
Figure 6B:
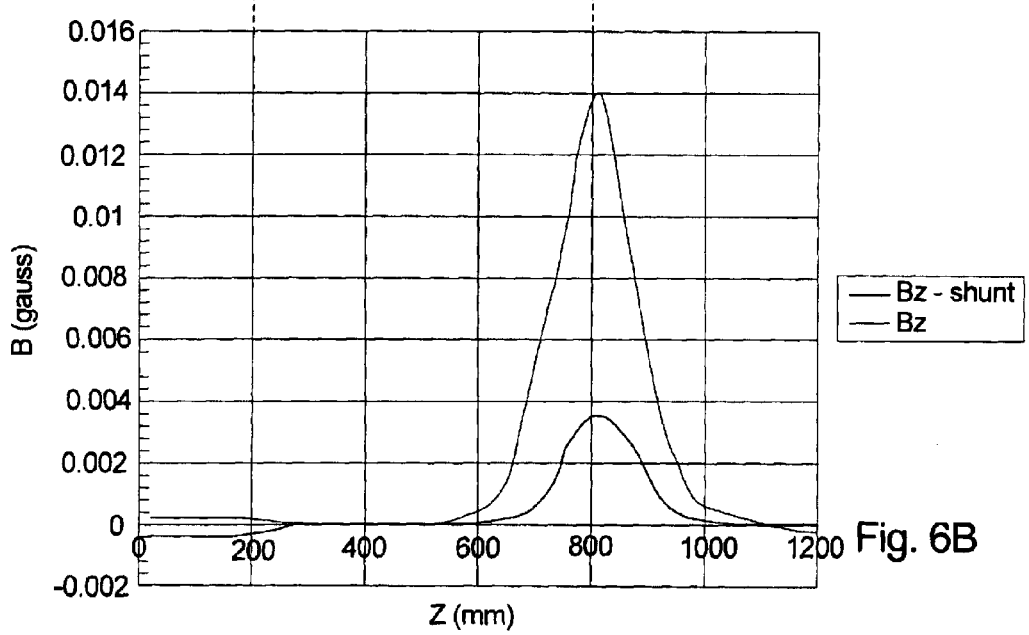

FIGS. 6A and 6B illustrate the effect of the magnetic shunt subassembly 100 on the DC magnetic fields from the movers 62A, along the longitudinal axis 108, with a layout of the stage assembly similar to that in FIGS. 3A–3C. In the simulation the two movers 60A are located at distances 366.56 mm and 766.56 mm from the longitudinal axis 108.

The effects of the magnetic field changes described in FIGS. 6A, 6B can be represented by calculating the corresponding deflection of the electron beam from the stray fields of the movers at the wafer plane for various stage positions. The effect of Bx is a transverse deflection of the beam; the effect of Bz is represented by a rotation of a corner of a 1.0 mm square subfield projected from the reticle to the wafer (where it is reduced in size to 0.250 mm). The deflections at two extreme stage positions (representing the closest and farthest distances from the column for the two linear motors) were calculated and are illustrated in Table 1 below. These results are based on simulations with a single mover 60A; two single mover solutions are summed appropriately to give the total contribution from the stage movers. (From symmetry, the total Bz component of the stray field from the two movers is the same at the two positions. Some components of the magnetic field from motors can be reduced in designs where identical motors are symmetrically located relative to the optical assembly.). While the absolute deflection of the e-beam by the linear motor DC magnetic field is significant even with the addition of the magnetic shunts, the change in deflection as the stage moves is much less than in the prior art; the e-beam shift caused by stage motion is reduced from 67.8 nm to 1.2 nm (for the Bx component of field). The explanation for this behavior seems to be that the magnetic shunts represent the lowest magnetic reluctance path for the linear motor DC magnetic fields regardless of their position relative to the column (and the magnetic shunt plates). Consequently, the flux through the magnetic shunts, and the magnetic fields near the magnetic shunts, and the column, are approximately independent of the mover position.

TABLE 1

| Case # | Deflection from Bx (nm) | Deflection from Bz (nm) | Motor distance (nm) | Notes |
| --- | --- | --- | --- | --- |
| 78 | 47.4 | 7.3 | 366.56 | no magnetic shunt |
| 79 | 13.5 | 2.4 | 766.56 | no magnetic shunt |
| 80 | 7.9 | 0.79 | 366.56 | magnetic shunt |
| 81 | 8.5 | 1.5 | 766.56 | magnetic shunt |
| 78–79 | 33.9 | 4.9 | 366.56, 766.56 | total deflection from movers |
| 80–81 (magnetic shunt) | −0.6 | −0.71 | 366.56, 766.56 | total deflection from movers |
| 78–79 | 67.8 | 0 | | difference between position 1 and position 2 |
| 80–81 (magnetic shunts) | −1.2 | 0 | | difference between position 1 and position 2 |

It should be noted that magnetic shunt assembly 12 changes the stray magnetic field along the optical assemblies 24, 26 not just close to the gaps 37, 67, where the movers are positioned. The total effect of the magnetic shunt assembly 12 on the shielding of the optical assemblies 24, 26 is therefore distributive. However, the amount of redirecting of the magnetic fields will vary upon the design of the magnetic shunt assembly, the design of the stage assembly, and the design of the optical assemblies 24, 26.

FIG. 7A illustrates another embodiment of the magnetic shunt assembly 12. More specifically FIG. 7A illustrates only part of the first stage assembly 14 and the first magnetic shunt ring 728. This embodiment may be employed in addition to any of the other embodiments of the invention. It may be advantageous in situations where the gap 37 must significantly exceed the vertical height of the device table 54A, in order to provide room for metrology or alignment sub-assemblies in proximity to the first stage 44. The enlarged gap reduces the intrinsic magnetic shielding of the optical assembly housings, allowing magnetic fields from the first stage mover assembly 16 to enter the gap 37 and adjacent regions of the optical assemblies 24, 26 more freely. If room permits, installation of a high magnetic permeability structure within the optical housings 724, 726 may reduce somewhat the stray magnetic field reaching the axis 108 of the optical system. The structure 728 may be a ring or it may have another shape, such as a sector of an annulus. In addition to having high magnetic permeability, it may be advantageous in some applications for the shunt ring 728 to have a high electrical resistance. Otherwise, rapidly changing magnetic fields within the optical assemblies, originating from magnetic deflection systems, might induce eddy currents in the shunt ring and produce additional stray time dependent magnetic fields. An appropriate material for such an application is a ferrite.

FIGS. 7B and 7C illustrate the expected behavior of the shunt ring 728. In the absence of the shunt ring 728 (FIG. 7B) magnetic field lines from the mover assembly penetrate the gap 37 and to some extent the optical housings 724, 726, reaching the axis 108 of the optical system. Illustrated are magnetic field lines 727 from one of the mover magnet components 62A. When the shunt ring 728 is present (FIG. 7C), its lower magnetic reluctance path attracts some of the magnetic field lines 727 to it, thereby reducing the stray magnetic field intensity along the optical system axis 108. The ring should not be too close to the optical system axis 108, however, or it might perturb the magnetic fields from the magnetic lenses in the optical assemblies 24, 26 and change the optical properties of the optical system.

In summary, the magnetic shunt assembly provided herein reduces the magnitude of stray magnetic fields in the respective gap without influencing the dynamic performance of the respective stage assembly. As provided herein, a reduction of the transverse component of the stray time dependent magnetic field in the gap can be greater than a factor of at least 10, and more preferably a factor of at least approximately 25, and even more preferably a factor of at least approximately 50 and still more preferably a factor of at least approximately 100. Stated another way, the magnetic shunt assembly redirects at least approximately 10 percent, and more preferably at least approximately 50 percent, and even more preferably at least approximately 90 percent or more of the stray magnetic field away from the gap.

While the particular magnetic shunt assembly 12 as herein shown and disclosed in detail are fully capable of obtaining the objects and providing the advantages herein before stated, it is to be understood that they are merely illustrative of embodiments of the invention and that no limitations are intended to the details of construction or design herein shown other than as described in the appended claims. Additional variations to the motor 10 are possible. For example, shields (not shown) made of magnetically permeable material can be positioned near the motor to further block stray magnetic fields.

What is claimed is:

1. A magnetic shunt assembly for an apparatus, the apparatus including an optical assembly, a gap near the optical assembly, a stage, and a mover assembly that moves the stage along an axis in the gap, the mover assembly generating a magnetic field, the magnetic shunt assembly comprising:

a first magnetic shunt positioned approximately between the optical assembly and the mover assembly, the first magnetic shunt being made of a magnetic permeable material, the first magnetic shunt providing a low magnetic reluctance path that redirects at least a portion of the magnetic field away from the gap.

2. The magnetic shunt assembly of claim 1 wherein the first magnetic shunt is spaced apart from the stage.

3. The magnetic shunt assembly of claim 1 wherein the first magnetic shunt is spaced apart from the optical assembly.

4. The magnetic shunt assembly of claim 1 wherein the first magnetic shunt is substantially tubular shaped and substantially encircles at least a portion of the optical assembly.

5. The magnetic shunt assembly of claim 1 wherein the first magnetic shunt is generally flat plate shaped.

6. The magnetic shunt assembly of claim 1 wherein the first magnetic shunt has a substantially "L" shaped cross-section.

7. The magnetic shunt assembly of claim 1 wherein the first magnetic shunt redirects at least approximately 10 percent of the magnetic field away from the gap.

8. The magnetic shunt assembly of claim 1 wherein the first magnetic shunt redirects the at least approximately 50 percent of the magnetic field away from the gap.

9. The magnetic shunt assembly of claim 1 further comprising a second magnetic shunt positioned approximately between the optical assembly and the mover assembly, the second magnetic shunt being made of a magnetically permeable material.

10. The magnetic shunt assembly of claim 9 wherein the first magnetic shunt and the second magnetic shunt are positioned on opposite sides of the stage.

11. The magnetic shunt assembly of claim 9 wherein the first magnetic shunt and the second magnetic shunt are positioned on opposite sides of the optical assembly.

12. The magnetic shunt assembly of claim 1 wherein the first magnetic shunt does not move relative to the optical assembly during operation of the stage assembly.

13. A stage assembly comprising a stage, a mover assembly, a container that encloses the stage and the magnetic shunt assembly of claim 1, wherein the first magnetic shunt is coupled to the container.

14. The stage assembly of claim 13 wherein the magnetic shunt assembly includes at least one container magnetic shunt that is positioned along a wall of the container.

15. An apparatus including the magnetic shunt assembly of claim 1 and an illumination source.

16. An object on which an image has been formed with the apparatus of claim 15.

17. A semiconductor wafer on which an image has been formed with the exposure apparatus of claim 15.

18. A stage assembly for moving a device for an apparatus, the apparatus including an optical assembly, a gap near the optical assembly, the stage assembly comprising:
a stage that retains the device;
a mover assembly that moves the stage along an axis in the gap, the mover assembly generating a magnetic field; and
a first magnetic shunt positioned approximately between the optical assembly and the mover assembly, the first magnetic shunt being spaced apart from the stage, the first magnetic shunt being made of a magnetic permeable material, the first magnetic shunt providing a low magnetic reluctance path that redirects at least a portion of the magnetic field away from the gap.

19. The stage assembly of claim 18 wherein the first magnetic shunt is spaced apart from the optical assembly.

20. The stage assembly of claim 18 wherein the first magnetic shunt is substantially tubular shaped and substantially encircles at least a portion of the optical assembly.

21. The stage assembly of claim 18 wherein the first magnetic shunt is generally flat plate shaped.

22. The stage assembly of claim 18 wherein the first magnetic shunt has a substantially "L" shaped cross-section.

23. The stage assembly of claim 18 wherein the first magnetic shunt redirects at least approximately 10 percent of the magnetic field away from the gap.

24. The stage assembly of claim 18 wherein the first magnetic shunt redirects at least approximately 50 percent of the magnetic field away from the gap.

25. The stage assembly of claim 18 further comprising a second magnetic shunt positioned approximately between the optical assembly and the mover assembly, the second magnetic shunt being made of a magnetically permeable material.

26. The stage assembly of claim 25 wherein the first magnetic shunt and the second magnetic shunt are positioned on opposite sides of the stage.

27. The stage assembly of claim 25 wherein the first magnetic shunt and the second magnetic shunt are positioned on opposite sides of the optical assembly.

28. The stage assembly of claim 18 wherein the first magnetic shunt does not move relative to the optical assembly during operation of the stage assembly.

29. The stage assembly of claim 18 further comprising a container that encloses the stage, wherein the first magnetic shunt is coupled to the container.

30. The stage assembly of claim 18 wherein the magnetic shunt assembly includes at least one container magnetic shunt that is positioned along a wall of the container.

31. An exposure apparatus including the magnetic shunt assembly of claim 18 and an illumination source.

32. An object on which an image has been formed with the exposure apparatus of claim 31.

33. A semiconductor wafer on which an image has been formed with the exposure apparatus of claim 31.

34. A method for reducing stray magnetic fields in a gap of an apparatus, the apparatus including an optical assembly, a stage, and a mover assembly that moves the stage along an axis in the gap, the mover assembly generating a magnetic field, the method comprising the step of:
positioning a first magnetic shunt positioned approximately between the optical assembly and the mover assembly, the first magnetic shunt being made of a magnetic permeable material, the first magnetic shunt providing a low magnetic reluctance path that redirects at least a portion of the magnetic field away from the gap.

35. The method of claim 34 wherein the step of positioning the first magnetic shunt includes the step of spacing the first magnetic shunt apart from the stage.

36. The method of claim 34 wherein the step of positioning the first magnetic shunt includes the step of spacing the first magnetic shunt apart from the optical assembly.

37. The method of claim 34 wherein the step of positioning the first magnetic shunt includes the step of providing a first magnetic shunt that is substantially tubular shaped, the first magnetic shunt substantially encircling at least a portion of the optical assembly.

38. The method of claim 34 wherein the step of positioning the first magnetic shunt includes the step of prQviding a first magnetic shunt that is substantially flat plate shaped.

39. The method of claim 34 wherein the step of positioning the first magnetic shunt includes the step of providing a first magnetic shunt that has a substantially "L" shaped cross-section.

40. The method of claim 34 further comprising the step of positioning a second magnetic shunt approximately between the optical assembly and the mover assembly, the second magnetic shunt being made of a magnetically permeable material.

41. The method of claim 40 wherein the step of positioning the second magnetic shunt includes the step of positioning the second magnetic shunt on the opposite side of the stage from the first magnetic shunt.

42. The method of claim 40 wherein the step of positioning the second magnetic shunt includes the step of positioning the second magnetic shunt on the opposite side of the optical assembly from the first magnetic shunt.

43. A method for making an exposure apparatus that transfers a pattern from a first object onto a second object, the method comprising the steps of:
providing an illumination system that illuminates the first object supported by a stage to form the image on the second object, the first object being positioned in a gap; and
reducing stray magnetic fields in the gap with the method of claim 34.

44. A method for making a device utilizing the exposure apparatus made by the method of claim 43.

45. A method for exposing a semiconductor wafer utilizing the exposure apparatus made by the method of claim 43.

46. A method for making a stage assembly that moves a device for an apparatus, the apparatus including an optical assembly, and a gap near the optical assembly, the method comprising the steps of:
providing a stage that retains the device;
moving the stage along an axis in the gap with a mover assembly, the mover assembly generating a magnetic field; and
positioning a first magnetic shunt approximately between the optical assembly and the mover assembly, the first magnetic shunt being spaced apart from the stage, the first magnetic shunt being made of a magnetic permeable material, the first magnetic shunt providing a low magnetic reluctance path that redirects at least a portion of the magnetic field away from the gap.

47. The method of claim 46 wherein the step of positioning the first magnetic shunt includes the step of spacing the first magnetic shunt apart from the optical assembly.

48. The method of claim 46 wherein the step of positioning the first magnetic shunt includes the step of providing a first magnetic shunt that is substantially tubular shaped, the first magnetic shunt substantially encircling at least a portion of the optical assembly.

49. The method of claim 46 wherein the step of positioning the first magnetic shunt includes the step of providing a first magnetic shunt that is substantially flat plate shaped.

50. The method of claim 46 wherein the step of positioning the first magnetic shunt includes the step of providing a first magnetic shunt that has a substantially "L" shaped cross-section.

51. The method of claim 46, further comprising the step of positioning a second magnetic shunt approximately between the optical assembly and the mover assembly, the second magnetic shunt being made of a magnetically permeable material.

52. The method of claim 51 wherein the step of positioning the second magnetic shunt includes the step of positioning the second magnetic shunt on the opposite side of the stage from the first magnetic shunt.

53. The method of claim 51 wherein the step of positioning the second magnetic shunt includes the step of positioning the second magnetic shunt on the opposite side of the optical assembly from the first magnetic shunt.

54. The method of claim 46 further comprising the step of enclosing the stage with a container and the step of securing the first magnetic shunt to the container.

55. A method for making an exposure apparatus that transfers a pattern from a first object onto a second object, the method comprising the steps of:
providing an illumination system that illuminates the device; and
moving the device with a stage assembly made by the method of claim 46.

56. A method for making a device utilizing the exposure apparatus made by the method of claim 55.

57. A method for exposing a semiconductor wafer utilizing the exposure apparatus made by the method of claim 55.

58. A stage assembly for moving a device for an apparatus, the apparatus including an optical assembly and a gap near the optical assembly, the stage assembly comprising:
a stage that retains the device;
a mover assembly that moves the stage along a first axis in the gap, the mover assembly generating a magnetic field; and
a first magnetic shunt positioned near the stage, the first magnetic shunt being fixedly positioned relative to the first axis, the first magnetic shunt being made from a magnetically permeable material, the first magnetic shunt providing a low magnetic reluctance path that redirects at least a portion of the magnetic field away from the gap.

59. The stage assembly of claim 58 wherein the mover assembly moves the stage along a second axis that is substantially perpendicular to the first axis, and wherein the first magnetic shunt is fixedly positioned along the second axis.

60. The stage assembly of claim 58 wherein the optical assembly includes a first subassembly and a spaced apart second subassembly, and wherein at least a portion of the stage moves between the first subassembly and the second subassembly.

61. The stage assembly of claim 58 wherein the first magnetic shunt is positioned approximately between the optical assembly and the mover assembly.

62. The stage assembly of claim 58 wherein the first magnetic shunt is oriented substantially perpendicularly to the stage.

63. The stage assembly of claim 58 wherein the first magnetic shunt is fixed relative to the optical assembly.

64. The stage assembly of claim 58 wherein the first magnetic shunt is substantially tubular shaped and substantially encircles at least a portion of the optical assembly.

65. The stage assembly of claim 58 wherein the first magnetic shunt is generally flat plate shaped.

66. The stage assembly of claim 58 wherein the first magnetic shunt has a substantially "L" shaped cross-section.

67. The stage assembly of claim 58 wherein the first magnetic shunt redirects at least approximately 10 percent of the magnetic field away from the gap.

68. The stage assembly of claim 58 wherein the optical assembly has a longitudinal axis, and wherein the first axis is substantially perpendicular to the longitudinal axis.

69. The stage assembly of claim 58 wherein the optical assembly has a longitudinal axis, and wherein the first magnetic shunt is positioned substantially parallel to the longitudinal axis.

70. The stage assembly of claim 58 further comprising a second magnetic shunt that is fixedly positioned relative to the first axis, the second magnetic shunt being made of a magnetically permeable material.

71. The stage assembly of claim 70 wherein the first magnetic shunt and the second magnetic shunt are positioned on opposite sides of the stage.

72. An apparatus including the stage assembly of claim 58 and an illumination source positioned near the stage assembly.

73. An object on which an image has been formed with the apparatus of claim 72.

74. A semiconductor wafer on which an image has been formed with the apparatus of claim 72.

75. A stage assembly for moving a device for an apparatus, the apparatus including an optical assembly having a first optical subassembly and a spaced apart second optical subassembly with a gap between the first optical subassembly and the second optical subassembly, the stage assembly comprising:

a stage that retains the device;

a mover assembly that moves at least a portion of the stage between the first optical subassembly and the second optical subassembly, the mover assembly generating a magnetic field; and a first magnetic shunt positioned near the stage, the first magnetic shunt being made from a magnetically permeable material, the first magnetic shunt providing a low magnetic reluctance path that redirects at least a portion of the magnetic field away from the gap.

76. The stage assembly of claim 75 wherein the optical assembly has a longitudinal axis, and wherein the first magnetic shunt is positioned substantially parallel to the longitudinal axis.

77. The stage assembly of claim 75 wherein the optical assembly has a longitudinal axis, and wherein the mover assembly moves the stage along a first axis that is substantially perpendicular to the longitudinal axis.

78. The stage assembly of claim 77 wherein the first magnetic shunt is fixedly positioned relative to the first axis.

79. The stage assembly of claim 77 wherein the mover assembly moves the stage along a second axis that is substantially perpendicular to the first axis and the longitudinal axis, and wherein the first magnetic shunt is fixedly positioned relative to the first and second axes.

80. The stage assembly of claim 75 wherein the first magnetic shunt is positioned approximately between the optical assembly and the mover assembly.

81. The stage assembly of claim 75 wherein the first magnetic shunt is fixed relative to the optical assembly.

82. The stage assembly of claim 75 wherein the first magnetic shunt is substantially tubular shaped and substantially encircles at least a portion of the optical assembly.

83. BAK The stage assembly of claim 75 wherein the first magnetic shunt is generally flat plate shaped.

84. The stage assembly of claim 75 wherein the first magnetic shunt has a substantially 75 shaped cross-section.

85. The stage assembly of claim 75 wherein the first magnetic shunt redirects at least approximately 10 percent of the magnetic field away from the gap.

86. The stage assembly of claim 75 further comprising a second magnetic shunt that is fixedly positioned relative to the first axis, the second magnetic shunt being made of a magnetically permeable material.

87. The stage assembly of claim 86 wherein the first magnetic shunt and the second magnetic shunt are positioned on opposite sides of the stage.

88. An apparatus including the stage assembly of claim 75 and an illumination source positioned near the stage assembly.

89. An object on which an image has been formed with the apparatus of claim 88.

90. A semiconductor wafer on which an image has been formed with the apparatus of claim 88.

* * * * *

UNITED STATES PATENT AND TRADEMARK OFFICE
CERTIFICATE OF CORRECTION

PATENT NO. : 6,794,657 B2
DATED : September 21, 2004
INVENTOR(S) : Sogard

It is certified that error appears in the above-identified patent and that said Letters Patent is hereby corrected as shown below:

Column 22,
Line 57, please delete the word "prQviding" and replace it with the word -- providing --.

Column 26,
Line 12, please delete "BAK".
Line 15, please delete "substantially 75 shaped" and replace it with -- substantially "L" shaped --.

Signed and Sealed this

Seventh Day of December, 2004

JON W. DUDAS
*Director of the United States Patent and Trademark Office*